United States Patent
Tanei et al.

[19]

[11] Patent Number: 6,118,671
[45] Date of Patent: *Sep. 12, 2000

[54] CIRCUIT SUBSTRATE AND MANUFACTURE THEREOF, CERAMIC COMPOSITION FOR CIRCUIT SUBSTRATE, AND ELECTRONICS COMPUTER

[75] Inventors: Hirayoshi Tanei; Shoichi Iwanaga; Masahide Okamoto, all of Yokohama; Masato Nakamura, Fujisawa; Kousaku Morita, Zama; Shousaku Ishihara, Chigasaki; Fumikazu Tagami; Norio Sengoku, both of Hadano; Tsuyoshi Fujita, Yokohama; Fumiyuki Kobayashi, Sagaminara, all of Japan

[73] Assignee: Hitachi, Ltd., Tokyo, Japan

[*] Notice: This patent is subject to a terminal disclaimer.

[21] Appl. No.: 09/103,812

[22] Filed: Jun. 24, 1998

Related U.S. Application Data

[63] Continuation of application No. 08/512,705, Aug. 8, 1995.

[30] Foreign Application Priority Data

Aug. 19, 1994 [JP] Japan .................. P06-195806

[51] Int. Cl.[7] ........................... H05K 1/11
[52] U.S. Cl. .............. 361/795; 361/795; 361/792; 361/748; 174/252; 174/255; 174/258; 174/261; 428/901
[58] Field of Search ................. 361/748, 792–795; 174/252, 255, 258, 261; 428/901

[56] References Cited

U.S. PATENT DOCUMENTS

| | | | |
|---|---|---|---|
| Re. 34,887 | 3/1995 | Ushifusa et al. | 361/795 |
| 4,598,167 | 7/1986 | Ushifusa et al. | 174/258 |
| 4,624,934 | 11/1986 | Kokubu et al. | 501/17 |
| 4,788,165 | 11/1988 | Fong et al. | 501/66 |
| 4,897,509 | 1/1990 | Holleran et al. | 361/792 |
| 4,942,076 | 7/1990 | Panicker et al. | 428/137 |
| 5,019,944 | 5/1991 | Ishii et al. | 361/400 |
| 5,256,470 | 10/1993 | Jean et al. | 428/210 |
| 5,362,551 | 11/1994 | Okamoto et al. | 174/258 |
| 5,382,757 | 1/1995 | Ishida | 174/262 |
| 5,407,473 | 4/1995 | Miura et al. | 252/512 |
| 5,805,425 | 9/1998 | Peterson | 361/769 |
| 5,825,632 | 10/1998 | Tanei et al. | 361/795 |

FOREIGN PATENT DOCUMENTS

| | | |
|---|---|---|
| 0445968 | 9/1991 | European Pat. Off. . |
| 4307600 | 9/1993 | Germany . |
| 9306053 | 4/1993 | WIPO . |

*Primary Examiner*—Leo P. Picard
*Assistant Examiner*—David Foster
*Attorney, Agent, or Firm*—Antonelli, Terry, Stout & Kraus, LLP

[57] ABSTRACT

Ceramic circuit substrate which is sintered at 900 to 1,050° C. and have low relative dielectric constant, thermal expansion coefficient comparable to that of silicon, and high bending strength, and a method of manufacturing are provided by using a glass with a softening point of 850 to 1,100° C., that is, a glass having a composition included in an area in FIG. 1 (triangular composition diagram of $SiO_2$—$B_2O_3$—$R_2O$, a composition is represented by the position of a small circle, the number in a small circle represents the composition number) defined with lines connecting points representing the first, third, tenth, eleventh, and fourth compositions respectively as raw material.

44 Claims, 11 Drawing Sheets

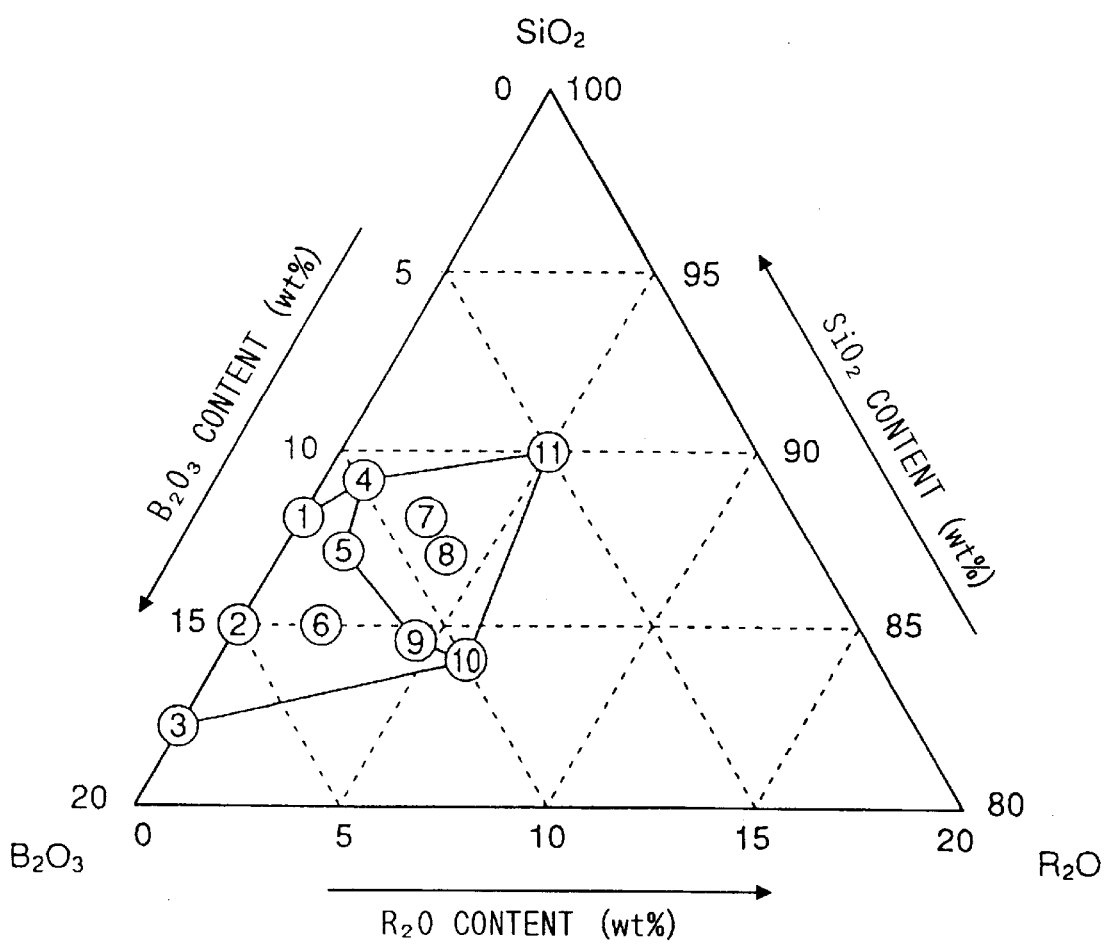

CIRCUIT SUBSTRATE AND MANUFACTURE THEREOF, CERAMIC COMPOSITION FOR CIRCUIT SUBSTRATE, AND ELECTRONICS COMPUTER

This application is a Continuation application of application Ser. No. 08/512,705; filed Aug. 8, 1995, the contents of which are incorporated herein by reference in their entirety.

BACKGROUND OF THE INVENTION AND RELATED ART STATEMENT

The present invention relates to a circuit substrate and the technology for providing the circuit substrate, and more particularly to a circuit substrate, which is suitable especially when organic binder is used as a binder and base metal conductive material such as copper is used as conducting material, a method of manufacturing thereof, and glass and ceramic composition for manufacturing the circuit substrate.

Conventionally, for multilayer circuit substrate on which silicon semiconductor integrated circuit elements are mounted, alumina ($Al_2O_3$) has been used as insulating material, molybdenum (Mo) and tungsten (W), which have high melting point and are possible to be co-sintered with alumina, has been used as conducting material. However, because the thermal expansion coefficient of alumina is as high as about $7 \times 10^{-6}/°$ C., when silicon semiconductor elements are mounted directly on an alumina substrate, the conductive connection is subjected to the serious stress, and the connection become unreliable. In addition, because of high relative dielectric constant of alumina as high as about 10, the signal transmission is not sufficiently fast as expected for high performance multilayer circuit substrate. Moreover, the resistance of above-mentioned metals are relatively high. To solve the problems, in Japanese Patent Provisional Publication Heisei-2-49550 (1990), a multilayer ceramic circuit substrate and manufacture thereof having copper conducting layer and glass ceramic layer containing a mixture consisting of 20% or more and less than 50% by weight of alumina, 10% or more and less than 60% by weight of quartz glass, and 20% or more and less than 40% by weight of amorphous glass or crystallized glass, and using a binder containing thermal depolymerization type resin.

OBJECT AND SUMMARY OF THE INVENTION

Generally, in the manufacturing process of ceramic substrate, in the first step an organic binder is added to ceramic powder to prepare green sheet. As the organic binder, polyvinyl-butyral resin and thermal depolymerization type acrylic resin are used generally. As a solvent for these binder resins, usually organic solvents such as methyl-ethyl-ketone and methanol are used. These organic solvents involve the problems of explosion risk and toxicity to human body. Therefore from the view point of safety and hygiene, organic binder material which utilizes water as solvent is preferable than that utilizes organic solvent. However, because water soluble organic binder material usually has hydrophilic functional groups, such organic binder material is not easily thermally decomposed comparing with organic binder material which utilizes organic solvent, and involves a problem of difficulty in binder removal as described hereunder.

To improve the performance and reliability of the above mentioned multilayer ceramic circuit substrate for mounting on silicon semiconductor integrated circuit elements, various properties are required for ceramic substrate material, that is, the ceramic substrate can be sintered at a temperature of 1,050° C. or below which temperature is lower than the melting point of copper so as that copper of low conductive resistance is used, has low relative dielectric constant, has the thermal expansion coefficient approximately equal to that of silicon, and is excellent in bending strength. As ceramic material which satisfies these conditions, filler-containing borosilicate glass is known.

However, filler-containing borosilicate glass involves a problem of water resistance of borosilicate glass when green sheet is prepared. Because of poor water resistance, boron oxide contained in borosilicate glass is easily eluted, therefore boric acid crystals deposits on the glass surface in a high humidity atmosphere. The crystallized boric acid will cause unpreferable failure in printing when conductive material is printed on the green sheet. Some borosilicate glass crystallizes crystobalite crystal when heat-treated. Crystobalite crystal has a transition of crystal phase at about 230° C. in which crystobalite exhibits significant volume change, the transition causes the cracking of the substrate, so the crystallization is not preferable.

On the other hand, for suitable use of copper as conducting material, it is preferable that the binder removal process (a process for burning organic binder for preparation of green sheet) is conducted in an atmosphere which does not oxidize copper. As such atmosphere, steam, nitrogen, and hydrogen atmosphere are known.

The burning of organic binder proceeds stepwise, in the first step organic resin decomposes to form carbon and subsequently carbon is oxidized. The former step proceeds at a temperature of about 200 to 400° C. and the latter step proceeds at a temperature of approximately 700° C. or higher. Especially the latter step is a reaction represented by the chemical formula;

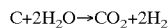

$$C + 2H_2O \rightarrow CO_2 + 2H_2$$

and the reaction proceeds faster in the higher temperature atmosphere. Therefore, burning of organic binder at higher temperature facilitates the removal of binder to lead the high productivity. However, if sintering of glass ceramic substrate material proceeds excessively during the heat treatment, the sintering causes the inclusion of residue of organic resin and carbon in the sheet, the inclusion causes unpreferable problems such as the deterioration of insulation quality of glass ceramics and insufficient compaction of glass ceramics during subsequent heat treatment. The excessive sintering of glass ceramic substrate material during heat treatment for burning organic binder is not preferable. As described hereinbefore, the thermal decomposition of water soluble organic binder material is slower than that of organic solvent-soluble organic binder material. Therefore the use of water soluble organic binder material requires the use of glass ceramic substrate material which is suitable for use with water soluble organic binder material. Usually, residual carbon content of 200 ppm or less in substrate is preferable.

After burning of organic binder, glass ceramics is subjected to heat treatment for compaction. The heat treatment is referred as sintering in other ward. For higher productivity of multilayer ceramic circuit substrate manufacturing, short time heat treatment is required.

Accordingly, it is an object of the present invention to provide a method for manufacturing ceramic circuit substrate which is sintered at a temperature of 1,050° C. or below, having low relative dielectric constant, the thermal expansion coefficient approximately equal to that of silicon ($3.0 \times 10^{-6}$/° C.), and excellent bending strength, and ceramic material to be used for the substrate.

To accomplish the object described above, the present invention provides a manufacturing process of circuit substrate comprising a series of four steps described hereinafter (1) to (4), glass and ceramic composition used for the manufacturing process, circuit substrate manufactured through the process, and electronic computers provided with the circuit substrate.

(1) a process for preparation of a slurry by mixing glass, filler, organic binder, and solvent, (2) a process for preparation of green sheet from the slurry, (3) a process for forming conductor by forming via hole and/or wiring using conducting material on the green sheet, and (4) a process for heating the green sheet at 700 to 880° C. to remove the binder and followed by heating at 900 to 1,050° C. to sinter, wherein the glass contains $SiO_2$, $B_2O_3$, $R_2O$ (R represents alkali metal), and unavoidably accompanied impurities, and have a composition included in an area, in FIG. 1 of a triangular composition diagram of $SiO_2$—$B_2O_3$—$R_2O$ defined with five lines of a line connecting a point of first composition and a point of third composition, a line connecting the point of third composition and a point of tenth composition, a line connecting the point of tenth composition and a point of eleventh composition, a line connecting the point of eleventh composition and a point of fourth composition, and a line connecting the point of fourth composition and the point of first composition (the area includes the lines). In FIG. 1, the points representing the compositions are indicated with small circles, and numerals in the circles represent composition number of the circle.

The first composition consists of 88% by weight of $SiO_2$ and 12% by weight of $B_2O_3$, the third composition consists of 82% by weight of $SiO_2$ and 18% by weight of $B_2O_3$, the tenth composition consists of 84% by weight of $SiO_2$, 10% by weight of $B_2O_3$, and 6% by weight of $R_2O$, the eleventh composition consists of 90% by weight of $SiO_2$, 5% by weight of $B_2O_3$, and 5% by weight of $R_2O$, and the fourth composition consists of 89% by weight of $SiO_2$, 10% by weight of $B_2O_3$, and 1% by weight of $R_2O$, respectively based on 100% by weight of the all components of $SiO_2$, $B_2O_3$, and $R_2O$.

In the area described above in FIG. 1, a composition included in an area defined with five lines of a line connecting the point of fourth composition and a point of fifth composition, a line connecting the point of fifth composition and a point of ninth composition, a line connecting the point of ninth composition and the point of tenth composition, the line connecting the point of tenth composition and the point of eleventh composition, and the line connecting the point of eleventh composition and the point of fourth composition (the area includes the lines) is more preferable.

The fifth composition consists of 87% by weight of $SiO_2$, 11.5% by weight of $B_2O_3$, and 1.5% by weight of $R_2O$, and the ninth composition consists of 84.7% by weight of $SiO_2$, 10.8% by weight of $B_2O_3$, and 4.5% by weight of $R_2O$.

In addition to the composition mentioned above, glass having a composition containing 90% or less of $Al_2O_3$ to molar amount of $R_2O$ additionally is more preferable, and 1 to 4% by weight of ZnO to the total weight of glass may be contained additionally.

For the component ratio of glass and filler, inclusion of 60 to 95% by volume of glass and 40 to 5% by volume of filler to the total 100% by volume of glass and filler is preferable.

The triangular composition diagram is a diagram for representing the composition of three component system using triangular coordinate. In a triangular diagram, the vertexes of a regular triangle (referred as to A, B, and C) represents pure substances of three components respectively, a point (including the place on the sides) in the regular triangle represents a composition comprising at least one component of the three. The proportional length of segmental lines drawn perpendicularly from a point P in a triangular diagram which represents a corresponding composition to the opposite sides of each vertex represents the proportion of each component contained in the composition. That is, the length of a perpendicular-h drawn from the point P to the opposite side-a of the vertex A represents the proportion of the component of A. To obtain the length of a segmental line-h, a line is drawn from the point P perpendicularly to the segmental line-h to intersect with the side on which a percentage (or fraction) scale of component of A is marked, and the scaled value is read at the intersection.

Each component of glass is converted to oxides respectively. That is, the amount of $SiO_2$ component means the amount which is determined by converting the amount of silicon contained in a glass to the amount of silicon dioxide ($SiO_2$), the amount of $B_2O_3$ means the amount which is determined by converting the amount of boron contained in a glass to the amount of boron oxide ($B_2O_3$), the amount of $R_2O$ component means the amount which is determined by converting the amount of alkali metal contained in a glass to the amount of alkali metal oxide ($R_2O$), the amount of $Al_2O_3$ means the amount which is determined by converting the amount of aluminum contained in a glass to the amount of aluminum oxide ($Al_2O_3$), and the amount of ZnO component means the amount which is determined by converting the amount of zinc contained in glass to the amount of zinc oxide (ZnO).

One example of a process for manufacturing circuit substrate in accordance with the present invention is shown schematically in FIG. 2. The manufacturing process shown in FIG. 2 comprises;

(1) a slurry process in which a glass ceramic composition comprising glass and filler, organic binder, and solvent are mixed in a ball mill 1 to prepare slurry as shown in FIG. 2(a), (2) a green sheet making process in which slurry 2 is formed into sheet using the casting machine 3 to prepare green sheet 4 as shown in FIG. 2(b), (3) a punching process for punching through holes 51 on the green sheet 4 using the punch 5 as shown in FIG. 2(c), (4) a printing process in which conducting paste 7 placed on the green sheet 4 is filled in through holes 51 of the green sheet 4 using a squeegee 6 to form via holes 53 and conductive paste is printed on the green sheet surface to form wiring 52 as shown in FIG. 2(d), (5) a laminating process for laminating and bonding a plurality of green sheets 4 having via holes 53 and wiring 52 obtained in the process in FIG. 2(d) to form a green sheet laminate 41 as shown in FIG. 2(e), (6) a binder removing process for removing binder by heating the obtained green sheet laminate 41 at 700 to 880° C. in the electric furnace 8 and a sintering process for sintering the laminate at a temperature of 900 to 1,050° C. as shown in FIG. 2(f), wherein these processes are applied in the order as described hereinabove.

Glass ceramic composition constituting green sheet of the present invention (namely used in the slurry process) is a composite material comprising glass particles and filler particles, the glass in such composition is softened and fluidized by heating during heat treatment, and the contact between glass particles increase to reduce the surface area of glass particles, namely to cause the mutual sintering of glass particles. The temperature at which glass is softened and fluidized and sintered depends on softening point of the glass, the amount of filler mixed with the glass particle, and the particle size of the glass particle and filler particle. Generally, the more amount of filler makes the sintering of glass particle more difficult because filler obstructs the mutual sintering of glass particles.

As described hereinabove, it is preferable that sintering of glass particle is prevented during heat treatment for burning organic binder contained in green sheet. The more addition of filler is examined. The excessive addition of filler causes the difficulty in compact sintering of glass. Heat treatment temperature for compact sintering is limited to a temperature of 1,050° C. or below slightly below the melting point of copper of 1,083° C., in the case that glass is sintered under such condition, prolonged sintering and pressurized sintering are applied. However, these heat treatment conditions are not preferable for production of multilayer ceramic circuit substrate from the view point of productivity.

As glass component to be contained in glass ceramic composition for multilayer ceramic circuit substrate, borosilicate glass, typically Pyrex glass (brand name of Corning Co.), is used in favor of properties required for substrate such as thermal expansion coefficient and relative dielectric constant. Pyrex glass composition consists of 81% by weight of $SiO_2$, 12% by weight of $B_2O_3$, 4% by weight of $Na_2O$, and 3% by weight of $Al_2O_3$, and has the softening point of 821° C., Pyrex glass is one of commercially available borosilicate glasses with highest softening point. The production cost of a borosilicate glass with higher softening point than Pyrex is high, and it is difficult to get commercially available mass-produced glass with such high softening point.

The inventors of the present invention have studied the manufacturing of multilayer ceramic substrate using Pyrex glass, and found that the sintering of glass particles proceeded during binder removing process (heat treatment at 700 to 880° C. in a non-oxidative atmosphere) when only a small amount of filler was added because the softening point of Pyrex was too low, residue of organic binder was trapped in the glass to cause the incomplete removal of organic binder. On the other hand, when the amount of filler was increased to 50% or more by volume, sintering of glass particles was suppressed and organic binder was removed easily. However, the much amount of filler obstructed the compact sintering, and it took time as long as 10 hr or longer in spite of high sintering temperature at 1,050° C. The softening point lower than 850° C. is not preferable because of too easy sintering of glass particles, and on the other hand, the softening point higher than 1,100° C. is also not preferable because of difficulty in compact sintering under a sintering temperature at 1,050° C. or lower.

Glass contained in ceramic composition of the present invention has a softening point of as high as 850 to 1,100° C. Therefore, in the case of green sheet which utilizes ceramic composition of the present invention, the sintering of glass particles will not proceed during binder removing process (heat treatment at 700 to 880° C. in a non-oxidative atmosphere), and even when water soluble organic binder which is not readily thermally decomposable is used, residue of organic binder is not trapped in the glass, and the binder removal is easy. In addition, green sheet prepared using glass ceramic composition of the present invention is compactly sintered within a short time (only 2 hr) at a sintering temperature of 1,050° C. or lower in the compact sintering process.

Borosilicate glass of the invention has a small relative dielectric constant, the small relative dielectric constant facilitates the fast signal transmission, the facilitation is advantageous for multilayer circuit substrate. Borosilicate glass of the invention has a small thermal expansion coefficient, the thermal expansion coefficient of the borosilicate glass is equalized to that of silicon by mixing with filler, and has excellent water resistance which results in no crystallization of boric acid crystal on green sheet and lead to enhanced productivity. Glass ceramic composition of the present invention is preferable also because of no crystallization of crystobalite crystal from borosilicate glass when the glass is heat-treated as described above. The thermal expansion coefficient of silicon is $3.0 \times 10^{-6}$° C., and that of sintered glass ceramics is preferably 2.0 to $4.0 \times 10^{-6}$° C.

Filler added to glass of the present invention is contained as particles dispersed in glass matrix after sintering, and has preferable effects such as;

(a) increase in mechanical strength of glass ceramics composite, (b) equalization of thermal expansion coefficient of glass ceramics composite to that of silicon, and (c) suppression of crystobalite crystallization from borosilicate glass when heat-treated. As described hereinbefore, high strength and low relative dielectric constant are desirable for glass ceramics composite. Alumina filler exhibits the advantages of (a) and (c), mullite and cordierite exhibit the advantages of (a), (b), and (c), and quartz glass exhibits the advantages of minimization of relative dielectric constant. In the present invention, these fillers are single materials or mixture materials of those fillers.

The glass composition of the present invention has been determined by experimental research from the view point of properties for excellent glass material such as softening point, water resistance, thermal expansion coefficient, crystallization of crystobalite crystal, and relative dielectric constant as described hereinbefore.

In the triangular composition diagram of $SiO_2$—$B_2O_3$—$R_2O$ system shown in FIG. 1, the first composition consists of 88% of $SiO_2$ and 12% of $B_2O_3$, the third composition consists of 82% of $SiO_2$ and 18% of $B_2O_3$, the tenth composition consists of 84% of $SiO_2$, 10% of $B_2O_3$, and 6% of $R_2O$, the eleventh composition consists of 90% of $SiO_2$, 5% of $B_2O_3$, and 5% of $R_2O$, and the fourth composition consists of 89% of $SiO_2$, 10% of $B_2O_3$, and 1% of $R_2O$ respectively in % by weight, the first glass composition area in accordance with the present invention is an area defined with five straight lines, namely a line connecting a point of first composition and a point of third composition, a line connecting the point of third composition and a point of tenth composition, a line connecting the point of tenth composition and a point of eleventh composition, a line connecting the point of eleventh composition and a point of fourth composition, and a line connecting the point of fourth composition and the point of first composition (the area includes the lines).

The softening point of glass included in the area ranges from 850 to 1,100° C., the water resistance is in a practical level, and the thermal expansion coefficient is adjustable to that of silicon by adding filler. $SiO_2$ and $B_2O_3$ form network structure of glass, the increase of $SiO_2$ content raises the softening point and improves the water resistance, and to the contrary, the increase of $B_2O_3$ content lowers the softening point and reduces the water resistance. $R_2O$ functions as network modifier, the increase of $R_2O$ lowers the softening point and improves the water resistance of $B_2O_3$ in a certain composition area.

Glass having a composition rich in $SiO_2$ in area above the lines connecting the first composition, the fourth composition, and the eleventh composition exhibits excessively high softening point, it is not preferable to accomplish the object of the present invention. Glass having a composition containing more $R_2O$ than composition on the line connecting the eleventh composition and the tenth composition exhibits excessively high thermal expansion coefficient, it is not preferable to accomplish the object of the present invention. The composition containing less $SiO_2$ than composition on the line connecting the third composition and the tenth composition exhibits excessive $B_2O_3$ elution, it is not preferable to accomplish the object of the present invention.

In the triangular composition diagram of $SiO_2$—$B_2O_3$—$R_2O$ system shown in FIG. 1, the fourth composition consists of 89% of $SiO_2$, 10% of $B_2O_3$, and 1% of $R_2O$, the fifth composition consists of 87% of $SiO_2$, 11.5% of $B_2O_3$, and 1.5% of $R_2O$, the ninth composition consists of 84.7% of $SiO_2$, 10.8% of $B_2O_3$, and 4.5% of $R_2O$, the tenth composition consists of 84% of $SiO_2$, 10% of $B_2O_3$, and 6% of $R_2O$, and the eleventh composition consists of 90% of $SiO_2$, 5% of $B_2O_3$, and 5% of $R_2O$ respectively in % by weight, the second glass composition area in accordance with the present invention is an area defined with five straight lines, namely a line connecting a point of fourth composition and a point of fifth composition, a line connecting the point of fifth composition and a point of ninth composition, a line connecting the point of ninth composition and a point of tenth composition, a line connecting the point of tenth composition and a point of eleventh composition, and a line connecting the point of eleventh composition and the point of fourth composition (the area includes the lines).

Glass having a composition included in this area exhibits especially high water resistance (namely reduced $B_2O_3$ elution) among glasses included in the above mentioned first composition area. Glass having a composition included in the second composition area is more preferable because green sheet prepared using the glass can be stored and handled in any atmosphere without restriction.

The third composition area of glass in accordance with the present invention is an area which is obtained by adding $Al_2O_3$ in an amount of 90% or less based on molar amount of $R_2O$ contained in glass having a composition included in the second composition area. R represents alkali metals such as Na and K. Glass having a composition included in the third composition area is most preferable because the existence of $Al_2O_3$ suppresses the crystallization of crystobalite crystal from glass when the glass is heat-treated. Glass containing $Al_2O_3$ in an amount exceeding 90% based on molar amount of $R_2O$ contained in the glass is not preferable because the softening point of the glass exceeds 1,100° C.

The mechanism of suppression of crystobalite crystallization by addition of $Al_2O_3$ is presumed as described herein under.

Glass of $SiO_2$—$B_2O_3$—$R_2O$ system has random-network structure constituted with Si atom coordinated with four oxygen atoms, B atom coordinated with three oxygen atoms, and B atom coordinated with four oxygen atoms as shown in FIG. 7(a). B atom coordinated with four oxygen atoms attracts R ion for charge compensation. When $Al_2O_3$ is added to the three component system, B atom coordinated with four oxygen atoms changes to B atom coordinated with three oxygen atoms and Al atom is coordinated with four oxygen atoms and attracts R ion as shown in FIG. 7(b). B atom coordinated with three oxygen atoms facilitates more easily the elution of $B_2O_3$ than B atom coordinated with four oxygen atoms. The addition of $Al_2O_3$ causes the slight increase in elution of $B_2O_3$, the increase is presumably attributed to the change of B atom coordinated with four oxygen atoms to B atom coordinated with three oxygen atoms.

The comparison of heat treatment of glass with and without $Al_2O_3$ addition is examined. As described herein above, glass without $Al_2O_3$ addition contains B atom coordinated with four oxygen atoms. As shown in FIG. 8(a), B—O bonding and attractive bonding to R ion are relatively weak in the structure of B atom coordinated with four oxygen atoms, therefore the bondings are broken in high temperature atmosphere and Si with non-bridging oxygen is easily formed presumably. The Si with non-bridging oxygen causes the reduced viscosity in high temperature atmosphere and crystobalite crystal crystallizes easily. On the other hand, in the case of glass with $Al_2O_3$ addition, Al atom coordinates with four oxygen atoms. As shown in FIG. 8(b), Al—O bonding and attractive bonding to R ion are relatively strong in the structure of Al atom coordinated with four oxygen atoms, the bonding is not easily broken in high temperature atmosphere, and crystobalite crystal crystallizes not easily. However, the addition of excessive amount of $Al_2O_3$ results in excessively high softening point of glass disadvantageously.

The fourth composition area of glass in accordance with the present invention is a composition area obtained by adding 1 to 4% by weight of ZnO in a glass in the first to third composition areas. Glass in the fourth composition area is featured by reduced $B_2O_3$ elution and low relative dielectric constant. When addition of ZnO is less than 1% by weight, the effect of the addition is not remarkable, and the addition of ZnO in an amount of more than 4% by weight causes disadvantageously the crystal crystallization from glass when heat-treated.

BRIEF DESCRIPTION OF THE DRAWINGS

FIG. 1 is a triangular composition diagram of $SiO_2$—$B_2O_3$—$R_2O$ system for representing the composition area of glass in accordance with the present invention.

FIG. 7 includes FIG. 7(a) and FIG. 7(b).

FIG. 8 includes FIG. 8(a) and FIG. 8(b).

DETAILED DESCRIPTION OF PREFERRED EMBODIMENTS

Figure 2A:
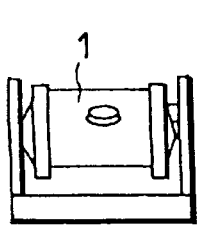
FIG. 2 is a schematic diagram for illustrating manufacturing process of multilayer circuit substrate.
Figure 2B:
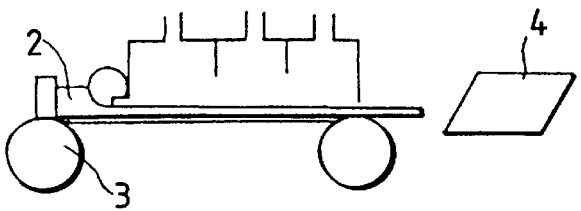
Figure 2C:
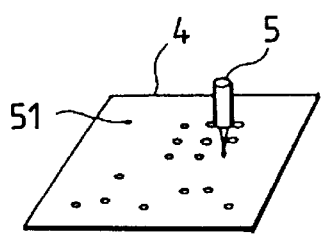
Figure 2D:
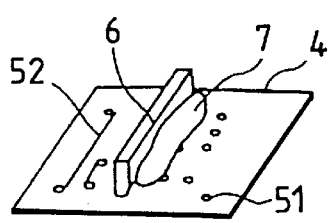
Figure 2E:
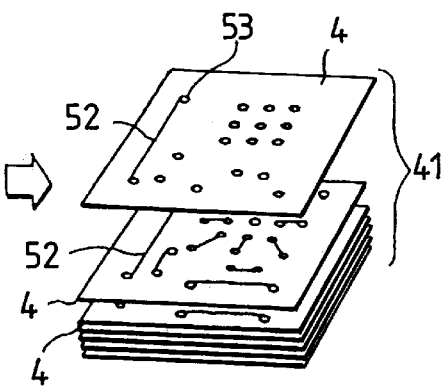
Figure 2F:
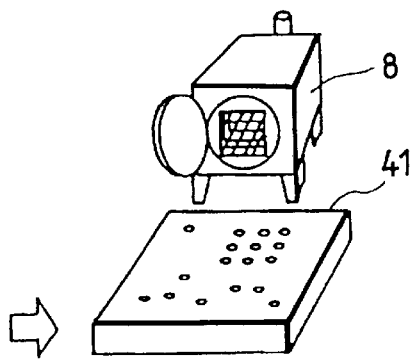

Preferred embodiments of the present invention will be described in detail referring to the drawings hereinafter.

Symbols and description used in the drawings are listed herein under.

1 . . . ball mill, 2 . . . slurry, 3 . . . casting machine, 4 . . . green sheet, 5 . . . punch, 6 . . . squeegee, 7 . . . paste, 8 . . . furnace, 9, 51 . . . via holes, 10, 52 . . . circuit lines, 11 . . . LSI, 12 . . . I/O pin, 13, 14 . . . connecting solder, 15 . . . micro-fin, 16 . . . water cooling jacket, 17 . . . multilayer circuit substrate, 18 . . . connector, 181 . . . main memory unit, 182 . . . extended memory unit, 183 . . . system controller, 184 . . . input/output processor, 185 . . . instruction processor.

EXAMPLE 1

(1) Preparation of glass

Silicic acid anhydride ($SiO_2$), boric acid ($H_3BO_3$), and potassium carbonate ($K_2CO_3$) materials were weighed in various combinations in amount for preparation of various compositions so as that $SiO_2$—$B_2O_3$—$R_2O$ glasses with desired compositions would be obtained finally, and the materials were mixed in a ball mill to obtain mixed powder. The mixed powder was put into a platinum crucible or a platinum-rhodium crucible, the crucible was placed in an electric furnace, heated for 1 hr at a temperature which melted the mixed powder in the crucible, taken out from the electric furnace, and soaked in water to obtain a glass block of borosilicate glass in the form of amorphous. The glass block taken out from the crucible was partially used as samples for measurement of thermal expansion coefficient and partially pulverized to prepare glass powder sample. For some of prepared samples (samples of the first composition to eleventh composition), composition, and heating temperature, $B_2O_3$ elution, softening point, thermal expansion coefficient, relative dielectric constant, and crystobalite crystallization of glasses, prepared using the samples having various compositions, are listed in Table 1. Compositions of the first composition to eleventh composition are plotted in FIG. 1 with small circles having the center at the point of the composition respectively. A numeral indicated in the circle represents the composition number respectively.

SiO₂—B₂O₃—R₂O glass compositions and properties (Table 1)

| Composition number | Composition (wt %) SiO₂ | B₂O₃ | K₂O | Heating temp. (° C.) | B₂O₃ elution (mg/m²) | Softening point (° C.) | Thermal expansion coefficient (× 10⁻⁶/° C.) | Relative dielectric constant | Crystobalite crystallization |
|---|---|---|---|---|---|---|---|---|---|
| 1  | 88   | 12   | 0   | 1700 | 6   | 1100 | 1.7 | 3.8 | − |
| 2  | 85   | 15   | 0   | 1700 | 10  | 1000 | 1.8 | 3.8 | − |
| 3  | 82   | 18   | 0   | 1700 | 20  | 850  | 1.8 | 3.8 | − |
| 4  | 89   | 10   | 1   | 1700 | 2.0 | 1100 | 2.1 | 4.0 | + |
| 5  | 87   | 11.5 | 1.5 | 1700 | 2.0 | 950  | 2.2 | 4.1 | + |
| 6  | 85   | 13   | 2   | 1700 | 4.0 | 880  | 2.3 | 4.2 | ++ |
| 7  | 88   | 9    | 3   | 1700 | 0.7 | 1000 | 2.5 | 4.4 | ++ |
| 8  | 87   | 9    | 4   | 1700 | 0.7 | 900  | 2.8 | 4.6 | ++ |
| 9  | 84.7 | 10.8 | 4.5 | 1650 | 2.0 | 860  | 2.8 | 4.7 | ++ |
| 10 | 84   | 10   | 6   | 1650 | 2.0 | 850  | 3.8 | 5.0 | ++ |
| 11 | 90   | 5    | 5   | 1700 | 0.5 | 1100 | 3.7 | 4.8 | ++ |

Figure 3:
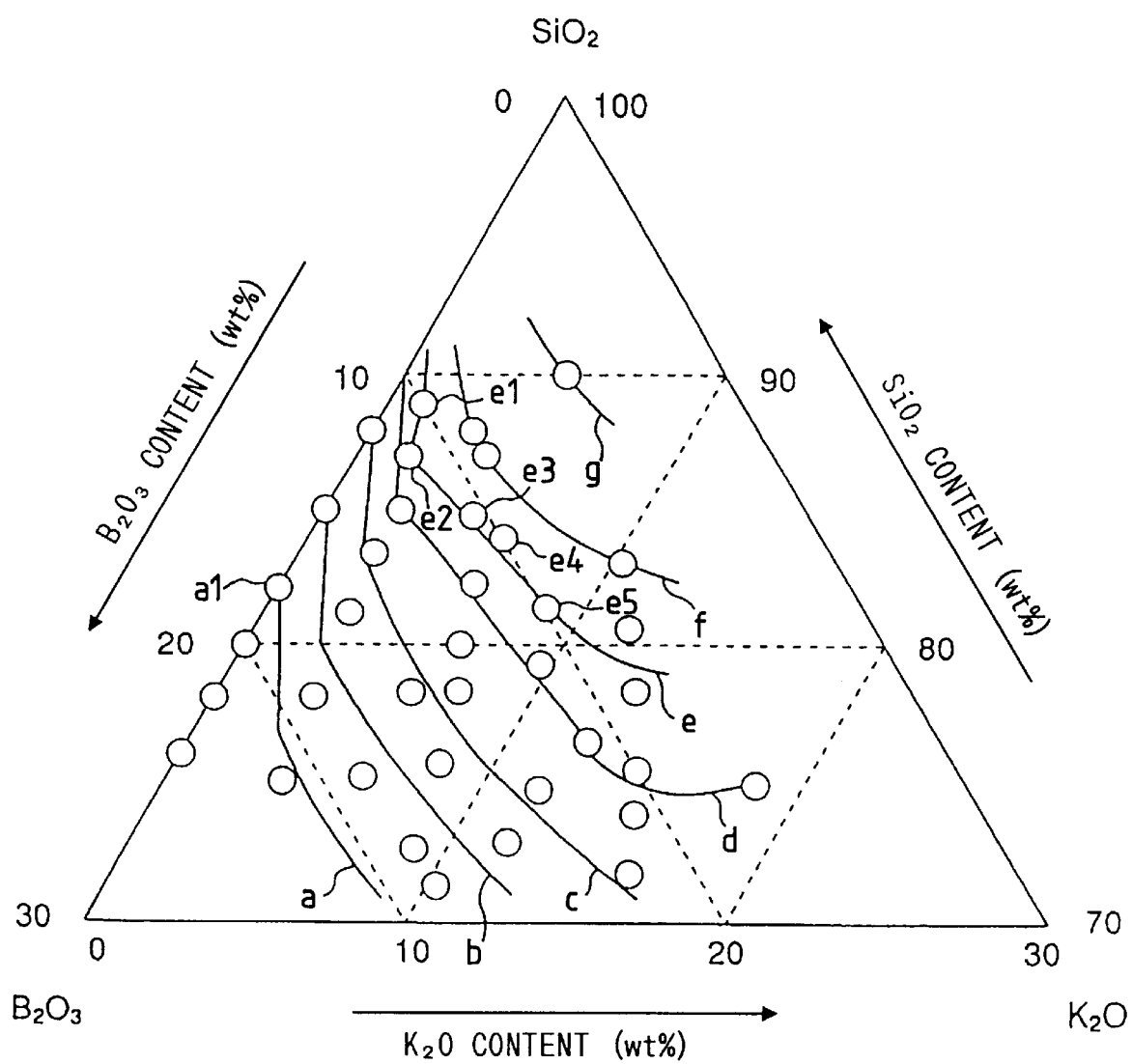
FIG. 3 is a triangular composition diagram of $SiO_2$—$B_2O_3$—$K_2O$ three component system for illustrating $B_2O_3$ elution curve.

−: No
+: Slightly
++: Significantly (2) Evaluation of water resistance of glass powder The water resistance of obtained borosilicate glass were evaluated as described below. 1 g of glass powder and 150 g of pure water were put into a 300 ml Teflon beaker (brand name of DuPont Co.), the beaker was covered with polyethylene film and kept at 90° C. in an oven with a thermostat for eight hours. The sample water was taken out, centrifuged to obtain supernatant, the supernatant was filtered to obtain filtrate, the filtrate was used as sample solution. B atom eluted in the filtrate was detected and determined by ICP (Inductively Coupled Plasma) emission spectral analysis. The specific surface area of glass was determined by BET (Brunauer-Emmett-Teller) method, and $B_2O_3$ elution per unit surface area of glass powder was calculated from the determined amount of B atom and the specific surface area of glass. The result is shown in FIG. 3. For glasses of the first composition to eleventh composition, determined $B_2O_3$ elution is listed also in Table 1. The plot in FIG. 3 includes the experimental result on glasses having compositions other than that listed in Table 1.

In FIG. 3, a line-a is the constant $B_2O_3$ elution curve of 20 mg/m², a line-b is the constant $B_2O_3$ elution curve of 10 mg/m², a line-c is the constant $B_2O_3$ elution curve of 6 mg/m², a line-d is the constant $B_2O_3$ elution curve of 4 mg/m², a line-e is the constant $B_2O_3$ elution curve of 2 mg/m², a line-f is the constant $B_2O_3$ elution curve of 0.7 mg/m², and a line-g is the constant $B_2O_3$ elution curve of 0.5 mg/m². As shown in FIG. 3, in the case of glass composition containing about 3% or less by weight of $K_2O$ as glass component, $B_2O_3$ elution decreases with the increasing of $K_2O$ component, in the case of glass composition containing about 3% or more by weight of $K_2O$, $B_2O_3$ elution increases with the increasing of $B_2O_3$.

(3) Evaluation of water resistance of green sheet

Green sheets were prepared using powder samples of $SiO_2$—$B_2O_3$—$K_2O$ glass having various compositions, green sheet samples were placed in a room temperature atmosphere of 55 to 92% relative humidity conditions, and the crystallization of boric acid was observed.

A green sheet of glass composition with $B_2O_3$ elution of 20 mg/m² (third composition in Table 1, shown as a1 in FIG. 3) did not crystallize significant boric acid crystal during exposure of one month in atmosphere of 55% relative humidity, but crystallized significant boric acid crystal during exposure of one week in atmosphere of 75% or higher humidity conditions.

In the cases in which five glass compositions with $B_2O_3$ elution of 2 mg/m² (fourth composition in Table 1 (shown as e1 in FIG. 3), fifth composition (shown as e2 in FIG. 3), ninth composition (shown as e3 in FIG. 3), tenth composition (shown as e4 in FIG. 3), and the composition shown as e5 in FIG. 3) were used, the exposure of two months in atmosphere of 75 to 92% relative humidity resulted in no significant crystallization of boric acid crystal.

Accordingly, the use of glass composition with $B_2O_3$ elution of 20 mg/m² or less allows the storage and handling in less-restricted atmosphere, and especially the use of glass composition with $B_2O_3$ elution of 2 mg/m² or less allows preferably the storage and handling in essentially not restricted atmosphere. A glass composition with $B_2O_3$ elution of 20 mg/m² is used practically though the atmosphere for storage and handling is limited to a certain degree, and used in the present invention if other properties are preferable.

(4) Evaluation of thermal expansion coefficient

Using prepared borosilicate glass samples, a glass block was formed into a stick sample with a diameter of 4 mm and length of 15 mm, and the thermal expansion coefficient was measured in a temperature range from 0 to 200° C. using a laser interferometry thermal expansion meter. The measured thermal expansion coefficient values of glasses of the first composition to eleventh composition are listed in Table 1. The thermal expansion coefficient of glasses of the first composition to the eleventh composition is as low as $4.0 \times 10^{-6}$/° C. or less for all compositions, and it is obvious that the thermal expansion coefficient of glass can be adjusted easily to that of silicon by adding filler.

(5) Evaluation of softening point

Softening point was measured by conventional differential thermal analysis using glass powder sample. The result of measurement is listed in Table 1 for the first composition to the eleventh composition. The softening point of 850 to 1,100° C. is preferable. The softening point of glasses of the first composition to eleventh composition is included in this temperature range for all compositions, from the result listed in Table 1, it is obvious that these compositions are suitable for the present invention.

(6) Evaluation of crystobalite crystallization 1 g of glass powder was molded to prepare a disk sample with a diameter of 15 mm by conventional press method, and the disk was heat-treated at 800° C. for 50 hr in an electric furnace to obtain a sintered disk. For the simulation of manufacturing condition for multilayer substrate, the heat treatment condition was employed. The sintered disk sample was subjected to X-ray diffractometry to determine crystobalite crystal. The result of measurement is listed in Table 1 for all glass compositions from the first to the eleventh. For all compositions, the crystobalite crystallization is in a practically usable range, though some crystobalite crystal is observed for $K_2O$ rich compositions of the sixth to eleventh.

(7) Evaluation of relative dielectric constant 10 g of glass powder sample was molded to prepare a disk sample with a diameter of 47 mm by conventional press method, and the disk sample was heat-treated at about 800° C. for 2 hr in an electric furnace to obtain a sintered disk sample. The sintered disk was processed to a disk with a thickness of 0.5 mm, a Cr/Cu film was spattered on the both sides for serving as electrode, and the electric capacity was measured using a LCR (inductance capacitance resistance) meter (measuring frequency: 1 MHz, input signal level: 1 Vrms) to obtain the relative dielectric constant. The measurement result was listed in Table 1 for all compositions of the first to eleventh. The relative dielectric constant is preferably 5.0 or less for all compositions of the first to eleventh.

(8) Summary of evaluation

The experimental result described hereinbefore is summarized as follows. A glass with composition included in the area defined with five lines (the area includes the lines) connecting in the order the point of first composition, the point of third composition, the point of tenth composition, the point of eleventh composition, the point of fourth composition, and the point of first composition, has a softening point in a range from 850 to 1,100° C., a water resistance of practically usable level, and a thermal expansion coefficient of $4.0 \times 10^{-6}/°$ C. or less which is adjustable to that of silicon by adding filler. The crystobalite crystallization and relative dielectric constant are in the practically usable range.

On the other hand, a glass with composition in the area defined with five lines (the area include the lines) connecting in the order from the point of fourth composition, the point of fifth composition, the point of ninth composition, the point of tenth composition, the point of eleventh composition, and to the point of fourth composition has the $B_2O_3$ elution of as particularly low as 2 mg/m² or less, the low elution allows preferably the storage and handling in essentially not restricted atmosphere.

EXAMPLE 2

$SiO_2$—$B_2O_3$—$Na_2O$ glasses with various compositions were prepared in the same manner as described in Example 1 excepting that sodium carbonate ($Na_2CO_3$) was used instead of potassium carbonate ($K_2CO_3$). The various properties of these glass samples were evaluated in the same manner as described in Example 1, it was found that these samples had heating temperature, softening point, thermal expansion coefficient, and relative dielectric constant suitable for the object of the present invention as described for $K_2O$-containing glass in Example 1. From the experimental result of water resistance and crystobalite crystallization, it was found that following properties were specific to $Na_2O$-containing glass.

Figure 19:
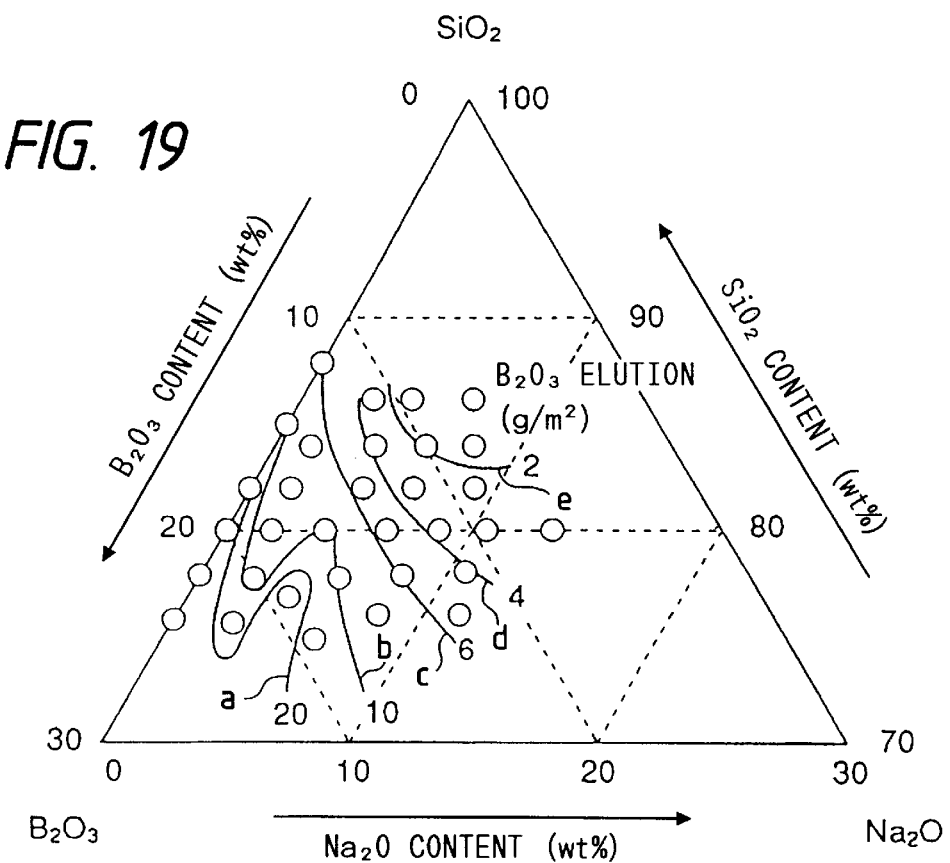
FIG. 19 is a triangular composition diagram of $SiO_2$—$B_2O_3$—$Na_2O$ three component system with $B_2O_3$ elution curves.

The $B_2O_3$ elution property of $SiO_2$—$B_2O_3$—$Na_2O$ glass is shown in FIG. 19. In FIG. 19, a line-a is the constant $B_2O_3$ elution curve of 20 mg/m², a line-b is the constant $B_2O_3$ elution curve of 10 mg/m², a line-c is the constant $B_2O_3$ elution curve of 6 mg/m², a line-d is the constant $B_2O_3$ elution curve of 4 mg/m², and a line-e is the constant $B_2O_3$ elution curve of 2 mg/m².

In the case of $B_2O_3$ elution curves for $SiO_2$—$B_2O_3$—$K_2O$ glass, the elution curves are arranged in parallel each other, but in the case of $B_2O_3$ elution curves for $SiO_2$—$B_2O_3$—$Na_2O$ glass, the elution curves are disordered (FIG. 19). The disorder is presumably attributed to the property of phase separation of $Na_2O$-containing glass, that is, the disposition of the phase to separate to two different glass phases with different compositions. The crystallization of crystobalite crystal of $Na_2O$ glass when heat-treated is larger than that of $K_2O$ glass, that is two times that of $K_2O$ glass, but the crystallization is not so serious as to prevent the practical use. Accordingly, both $Na_2O$ glass and $K_2O$ glass can be used for the present invention, but $K_2O$ glass of reduced phase separation and crystobalite crystallization is more preferably used.

EXAMPLE 3

Glass which contains $Al_2O_3$ in addition to $SiO_2$, $B_2O_3$, and $R_2O$ is examined. In this example, as an example of composition included in the area defined with five lines (the area includes the lines) connecting in the order from the point of first composition, the point of third composition, the point of tenth composition, the point of eleventh composition, the point of fourth composition, to the point of first composition in the triangular composition diagram for $SiO_2$—$B_2O_3$—$R_2O$ system, a mixed powder of silicic acid anhydride, boric acid, and potassium carbonate prepared as to contain 86.6% by weight of $SiO_2$, 9.3% by weight of $B_2O_3$, and 4.1% by weight of $K_2O$ (approximately similar to the eighth composition) was used. Alumina ($Al_2O_3$) powder was added to the mixed powder additionally in various amounts so as to prepare compositions listed in Table 2, the powder was mixed in a ball mill to obtain mixed powders having compositions of the twelfth composition to sixteenth composition listed in Table 2. Using these mixed powder, sample glasses were prepared in the same manner as described in Example 1, and the properties of these samples were evaluated. The ratio (molar ratio) of $Al_2O_3$ to $R_2O$ (in this example $K_2O$) for each composition, heating temperature, measured values of thermal expansion coefficient, and relative dielectric constant are listed in Table 2. It is obvious from the experimental result that the increase of $Al_2O_3$ content causes essentially no change in the thermal expansion coefficient and relative dielectric constant, and these measured values are included in the preferable range.

The effect of $Al_2O_3$ addition on the $B_2O_3$ elution is examined. The $B_2O_3$ elution of glass of the eighth

$SiO_2$—$B_2O_3$—$K_2O$—$Al_2O_3$ glass compositions and properties (Table 2)

Figure 4:
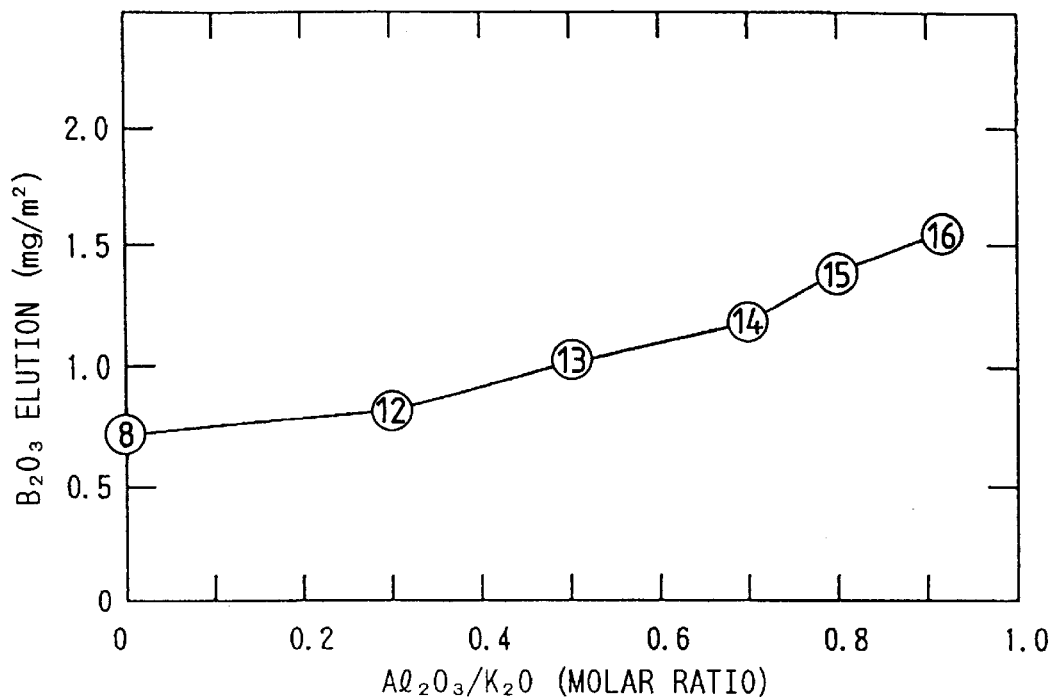
FIG. 4 is a graph for description of the relationship between $B_2O_3$ elution and $Al_2O_3/K_2O$ molar ratio for $SiO_2$—$B_2O_3$—$K_2O$—$Al_2O_3$ glass.

| Composition number | Composition (WT %) | | | | $Al_2O_3$ $K_2O$ (molar ratio) | Heating temp. (° C.) | Thermal expansion coefficient (× $10^{-6}$/° C.) | Relative dielectric constant |
|---|---|---|---|---|---|---|---|---|
| | $SiO_2$ | $B_2O_3$ | $K_2O$ | $Al_2O_3$ | | | | |
| 12 | 85.5 | 9.2 | 4.0 | 1.3 | 0.3 | 1700 | 2.8 | 4.7 |
| 13 | 84.7 | 9.1 | 4.0 | 2.2 | 0.5 | 1700 | 2.8 | 4.7 |
| 14 | 84.0 | 9.0 | 4.0 | 3.0 | 0.7 | 1700 | 2.8 | 4.7 |
| 15 | 83.6 | 9.0 | 4.0 | 3.4 | 0.8 | 1700 | 2.7 | 4.7 |
| 16 | 83.2 | 8.9 | 4.0 | 3.9 | 0.9 | 1750 | 2.7 | 4.8 | composition, which contains no $Al_2O_3$, and glasses of the twelfth to the sixteenth composition are shown in FIG. 4. In FIG. 4, the content of $Al_2O_3$ is normalized to the molar ratio to $K_2O$ content in glass composition. A number in a small circle represents the glass composition number. From FIG. 4, it is obvious that the $B_2O_3$ elution increases with the increasing of $Al_2O_3$ content. However, the increased $Al_2O_3$ content of as large as 90% to $K_2O$ molar content results in the $B_2O_3$ elution of only 1.6 mg/m², therefore the increase of $B_2O_3$ elution due to addition of $Al_2O_3$ causes no problem.

Figure 5:
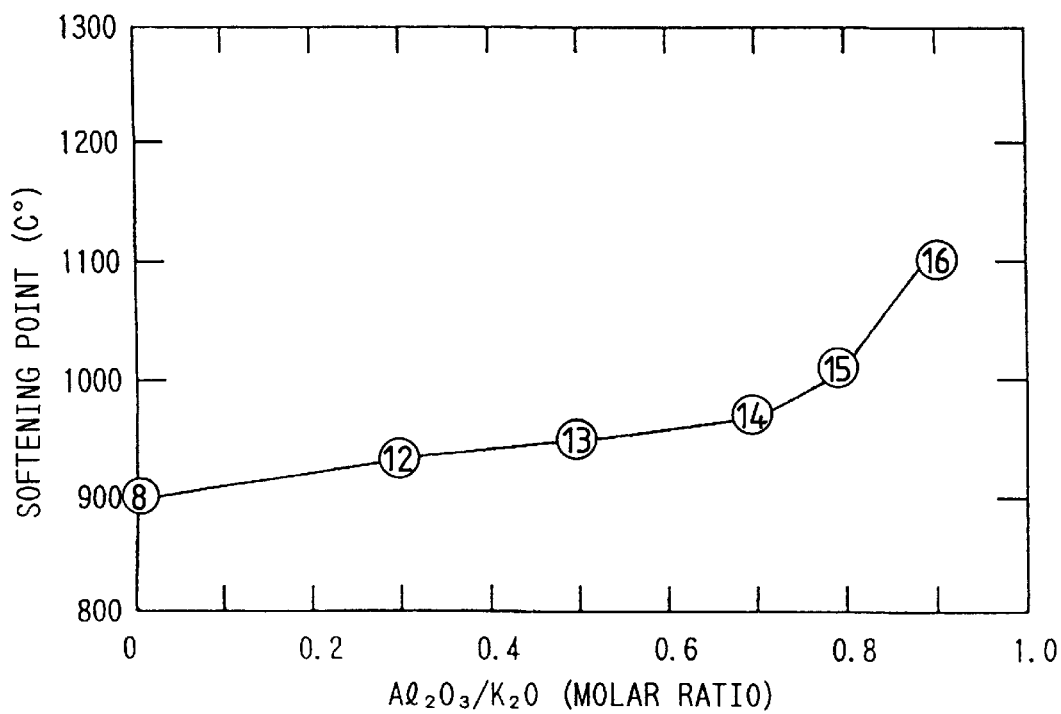
FIG. 5 is a graph for description of the relationship between softening point and $Al_2O_3/K_2O$ molar ratio for $SiO_2$—$B_2O_3$—$K_2O$—$Al_2O_3$ glass.

The effect of $Al_2O_3$ addition on the softening point is examined. The softening point of glass with compositions of the eighth, and the twelfth to the sixteenth is shown in FIG. 5. In FIG. 5, the content of $Al_2O_3$ is normalized to the molar ratio to $K_2O$ content in glass composition in the same manner as described in FIG. 4. A number in a small circle represents the glass composition number. From FIG. 5, it is obvious that $Al_2O_3$ content of exceeding 90% to $K_2O$ molar content results in the softening point of as high as exceeding 1,100° C. Therefore, such high $Al_2O_3$ content is not preferable.

Figure 6:
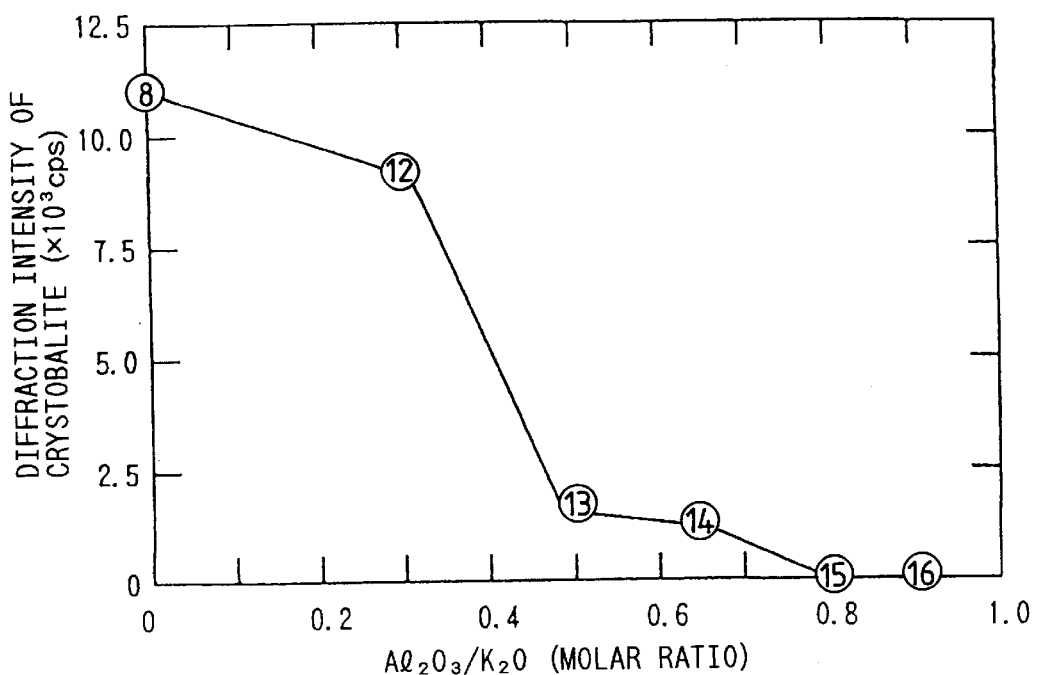
FIG. 6 is a graph for description of the relationship between crystobalite crystallization and $Al_2O_3/K_2O$ molar ratio for $SiO_2$—$B_2O_3$—$K_2O$—$Al_2O_3$ glass.
Figure 7A:
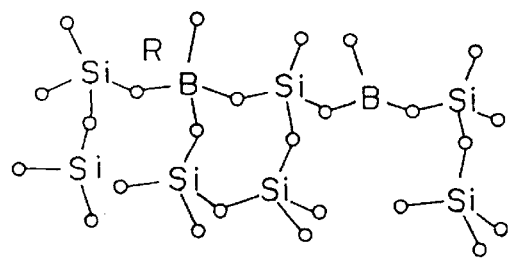
FIG. 7(a) is a schematic diagram for illustrating a structural model of $SiO_2$—$B_2O_3$—$R_2O$ glass.
Figure 7B:
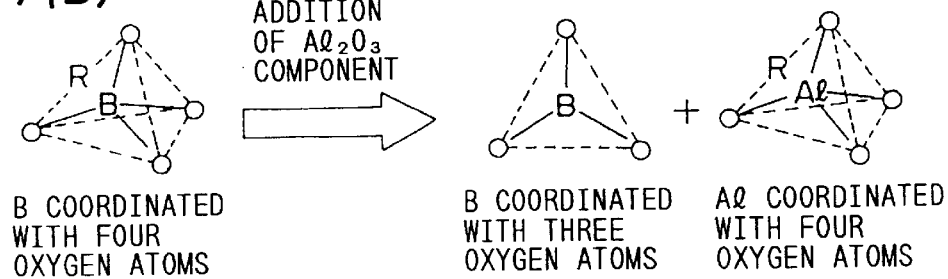
FIG. 7(b) is a schematic diagram for illustrating the structural change when $Al_2O_3$ is added to $SiO_2$—$B_2O_3$—$R_2O$ glass.
Figure 8A:
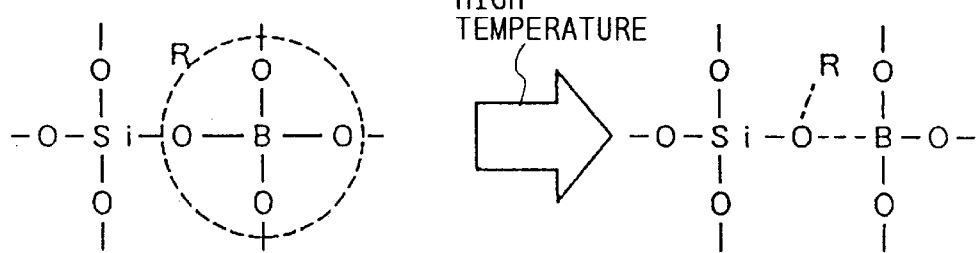
FIG. 8(a) is a schematic diagram for illustrating the structural change when $SiO_2$—$B_2O_3$—$R_2O$ glass is heated at high temperature and FIG. 8(b) is a schematic diagram for illustrating the structural change when $SiO_2$—$B_2O_3$—$R_2O$—$Al_2O_3$ glass is heated at high temperature.
Figure 8B:
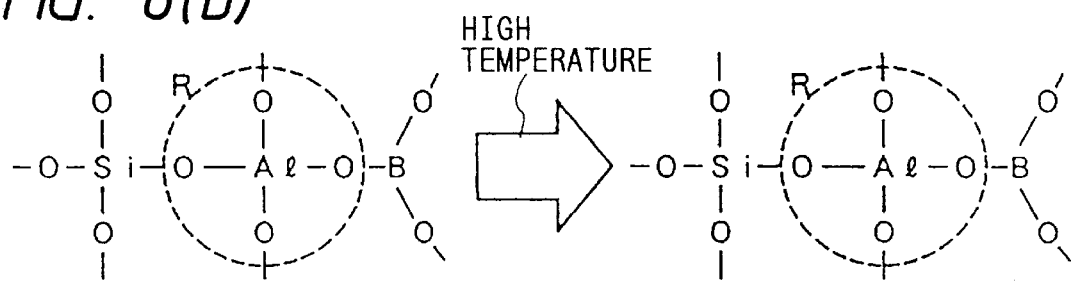

Finally, the effect of $Al_2O_3$ addition on the crystobalite crystallization (represented by diffraction intensity from crystobalite crystal) is examined. The crystobalite crystallization of glasses with the eighth composition, and the twelfth composition to the sixteenth composition is shown in FIG. 6. The content of $Al_2O_3$ is normalized to the molar ratio to $K_2O$ content in glass composition in the same manner as used in FIG. 4. A number in a small circle represents the glass composition number. From FIG. 6, it is obvious that the increased $Al_2O_3$ content results in the reduced crystobalite crystal X-ray diffraction intensity (namely amount of crystallized crystobalite crystal). In the case of $Al_2O_3$ content of 80% or more to $K_2O$ molar content, no crystobalite crystal crystallizes when heat-treated.

Crystobalite crystal has a transition point at about 230° C. at which the crystal phase transition occurs accompanying drastic volume change, the volume change causes cracking of substrate, therefore the crystallization is not preferable. However if filler material exhibits the effect of preventing the crystallization of crystobalite crystal in borosilicate glass during the reaction between glass and filler expected when sintering, actually the crystobalite crystal may not crystallize from glass-filler composite even when the glass-filler composite is subjected to the condition which will cause the crystallization of crystobalite crystal from glass composition without filler. Therefore, when a substrate is manufactured using a composite comprising glass and filler, the glass with a composition which causes the crystallization of crystobalite crystal from the glass containing no filler is also suitable for the present invention if the composite comprising the glass and filler causes no crystallization of crystobalite crystal. Glasses with the eighth composition and the twelfth composition can be used for the present invention. A glass which causes no crystallization of crystobalite crystal using the glass solely without filler when heat-treated is advantageously used because it allows the wider selection of fillers and stabilizes the manufacturing process.

From the experimental result described herein above, it is obvious that glass contains preferably $Al_2O_3$ in a molar ratio of 90% or less to $R_2O$. It is obvious that the addition of $Al_2O_3$ in a molar ratio of 50% or more to $R_2O$ suppresses significantly the crystallization of crystobalite crystal and 80% or more suppresses completely the crystallization preferably.

EXAMPLE 4

The addition of ZnO in addition to $SiO_2$, $B_2O_3$, $R_2O$, and $Al_2O_3$ (namely $SiO_2$—$B_2O_3$—$R_2O$—$Al_2O_3$—ZnO glass) is examined. Silicic acid anhydride boric acid, potassium carbonate, sodium carbonate, alumina, and zinc oxide (ZnO) powder were weighed so as to prepare glass compositions listed in Table 3, mixed in a ball mill, and mixed powders with the seventeenth composition to twenty-third composition listed in Table 3 were obtained. Using the mixed powders, glasses were prepared in the same manner as used in Example 1 and properties were evaluated. The heating temperature, $B_2O_3$ elution, softening point, thermal expansion coefficient, relative dielectric constant, and crystobalite crystallization were measured on these compositions and the result is listed in Table 3.

TABLE 3

SiO$_2$—B$_2$O$_3$—R$_2$O—Al$_2$O$_3$—ZnO glass compositions and properties

| Composition No. | Composition (wt %) | | | | | Heating temp. (° C.) | B$_2$O$_3$ elution (mg/m$^2$) | Softening point (° C.) | Thermal expansion coefficient (× 10$^{-6}$/° C.) | Relative dielectric constant | Crystobalite crystallization |
|---|---|---|---|---|---|---|---|---|---|---|---|
| | SiO$_2$ | B$_2$O$_3$ | R$_2$O | Al$_2$O$_3$ | ZnO | | | | | | |
| 17 | 82.0 | 13.0 | Na$_2$O = 1<br>K$_2$O = 1 | 1.0 | 2.0 | 1700 | 1.9 | 900 | 2.0 | 4.2 | + |
| 18 | 84.0 | 11.0 | Na$_2$O = 1<br>K$_2$O = 1 | 1.0 | 2.0 | 1700 | 1.2 | 950 | 2.3 | 4.2 | + |
| 19 | 86.0 | 9.0 | Na$_2$O = 1<br>K$_2$O = 1 | 1.0 | 2.0 | 1700 | 0.6 | 1000 | 2.0 | 4.2 | + |
| 20 | 85.0 | 8.0 | Na$_2$O = 1<br>K$_2$O = 1 | 3.0 | 2.0 | 1700 | 0.5 | 1060 | 2.3 | 4.3 | − |
| 21 | 84.0 | 9.0 | Na$_2$O = 1<br>K$_2$O = 1 | 3.0 | 2.0 | 1700 | 0.6 | 1040 | 2.3 | 4.3 | − |
| 22 | 83.0 | 10.0 | Na$_2$O = 1<br>K$_2$O = 1 | 3.0 | 2.0 | 1700 | 0.7 | 1020 | 2.2 | 4.3 | − |
| 23 | 83.0 | 10.0 | K$_2$O = 2 | 3.0 | 2.0 | 1700 | 0.7 | 1020 | 2.3 | 4.3 | − |

−: no   +: slightly   ++: significantly

As obvious from Table 3, glasses with the seventeenth composition to twenty-third composition have reduced B$_2$O$_3$ elution, thermal expansion coefficient, and relative dielectric constant, these results are preferable for the present invention. The softening point for all compositions ranges preferably from 900 to 1,060° C. No or slight crystobalite crystallization was observed for all compositions in favor of the present invention.

Figure 9:
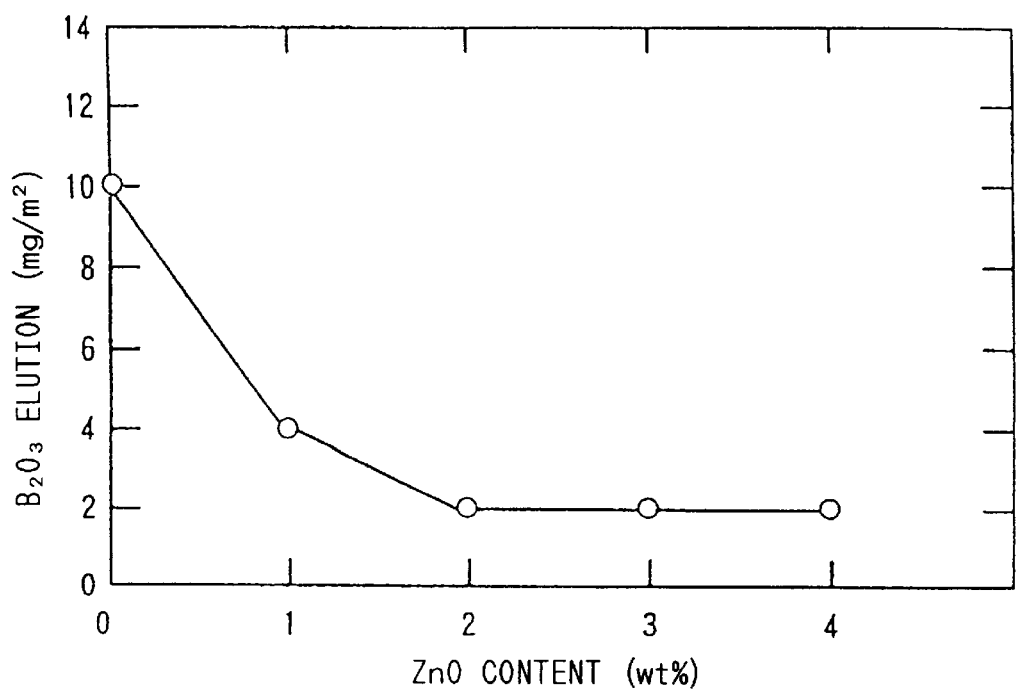
FIG. 9 is a graph for description of the relationship between $B_2O_3$ elution and ZnO content for $SiO_2$—$B_2O_3$—ZnO glass.

ZnO powder was added in various amounts to mixed powder material of the second composition (composition is listed in Table 1) to prepare glasses, and the B$_2$O$_3$ elution was measured in the same manner as described in Example 1. The relationship between ZnO content and B$_2$O$_3$ elution is shown in FIG. 9. It is obvious in FIG. 9 that the addition of ZnO reduces dramatically the B$_2$O$_3$ elution. It is understandable from the experimental result that the addition of ZnO is preferable for preparation of glass. As obvious in Table 3, SiO$_2$—B$_2$O$_3$—Na$_2$O—K$_2$O—Al$_2$O$_3$—ZnO glass is featured by low B$_2$O$_3$ elution and low relative dielectric constant. The addition of ZnO in an amount of less than 1% by weight affects scarcely and the addition of ZnO in an amount of more than 4% by weight causes the problem of crystallization from glass when heat-treated. Accordingly, from the result of this example, it is found that the addition of ZnO in an amount of 1% or more by weight and 4% or less by weight is preferable.

EXAMPLES 5 TO 21, AND COMPARATIVE EXAMPLE 1

(1) Preparation of sintered ceramics

The effect of addition of fillers to glass compositions is examined. Glass powder of the fourteenth composition (listed in Table 2) for Examples 5 to 12 and Comparative Example 1, glass powder of the ninth composition (listed in Table 1) for Examples 13 to 15, glass powder of the nineteenth composition (listed in Table 3) for Example 16, glass powder of the twenty-third composition (listed in Table 3) for Examples 17 to 20, and glass powder of the first composition (listed in Table 1) for Example 21 were prepared. Filler powder was mixed in various amounts in the glass powders to obtain 18 ceramic composites listed in Table 4. The average particle size (diameter) of the glass powders was about 4 microns and the average particle size of the filler was about 3 microns. Mullite (3Al$_2$O$_3$.2SiO$_2$) was used as filler for Examples 1 to 11, 13 to 15, 17 and 18, and Comparative Example 1, mullite and alumina (Al$_2$O$_3$) were used for Example 12, alumina and cordierite (2MgO.2Al$_2$O$_3$.5SiO$_2$) were used for Example 16, alumina was used for Examples 19 and 21, and alumina and quartz glass (SiO$_2$ glass) were used for Example 20.

100 parts by weight of obtained ceramic composition, about 14 parts by weight of water soluble organic binder containing modified acrylic resin as the main component, 75 parts by weight of water as solvent, and 0.3 part by weight of ammonium acrylate salt dispersant were mixed in a ball mill to prepare slurry. Hitaloid 2713 (brand name of Hitachi Chemical Co., Ltd.) was used as the water soluble binder because of excellent performance in accuracy of hole position and environmental safety and hygiene.

Then, using obtained slurry, green sheet with a thickness of 0.2 mm and width of 450 mm was prepared by doctor blade method. The green sheet was cut to 150 mm square and 50 mm square pieces. On a green sheet of 150 mm square, holes (via hole) with a diameter of 0.1 mm were punched with a 0.4 mm pitch. The holes were filled with copper paste by printing method, and copper paste was printed on the surface of green sheet to form a wiring pattern with a width of 0.08 mm by conventional method, then 4 to 50 green sheets were laminated by pressing at 130° C. for 10 min under a pressure of 20 MPa to form green sheet laminate. 4 to 50 green sheets of 50 mm square were laminated by pressing at 130° C. for 10 min under a pressure of 20 MPa to form green sheet laminate without punching and printing, the laminate was used as samples for measurement of strength, relative dielectric constant, and residual carbon.

Obtained green sheet laminate was placed in an electric furnace, atmosphere in which furnace is controllable, in an atmosphere of steam-nitrogen-hydrogen gas, the furnace temperature was raised from a room temperature to 700 to 880° C. at a heating rate of

TABLE 4

Borosilicate glass-filler compositions and properties

| | Glass composition number | Glass content (vol %) | Filler composition (vol %) | | | | Sintering temp. (° C.) | Thermal expansion coefficient (× 10⁻⁶/° C.) | Bending strength (MPa) | Relative dielectric constant |
| --- | --- | --- | --- | --- | --- | --- | --- | --- | --- | --- |
| | | | Mullite | Alumina | Cordierite | Quartz glass | | | | |
| Example 5  | 14 | 90 | 10 | 0  | 0  | 0  | 975  | 2.9 | 200 | 5.0 |
| Example 6  | 14 | 85 | 15 | 0  | 0  | 0  | 975  | 2.9 | 200 | 5.1 |
| Example 7  | 14 | 80 | 20 | 0  | 0  | 0  | 1000 | 3.0 | 200 | 5.2 |
| Example 8  | 14 | 75 | 25 | 0  | 0  | 0  | 1000 | 3.0 | 210 | 5.2 |
| Example 9  | 14 | 70 | 30 | 0  | 0  | 0  | 1020 | 3.1 | 220 | 5.3 |
| Example 10 | 14 | 65 | 35 | 0  | 0  | 0  | 1025 | 3.1 | 210 | 5.4 |
| Example 11 | 14 | 60 | 40 | 0  | 0  | 0  | 1050 | 3.2 | 200 | 5.5 |
| Example 1  | 14 | 55 | 45 | 0  | 0  | 0  | 1100 | 3.2 | 200 | 5.5 |
| Example 12 | 14 | 70 | 22 | 8  | 0  | 0  | 1020 | 3.6 | 210 | 5.4 |
| Example 13 | 9  | 80 | 20 | 0  | 0  | 0  | 900  | 3.0 | 200 | 5.3 |
| Example 14 | 9  | 70 | 30 | 0  | 0  | 0  | 950  | 3.1 | 200 | 5.4 |
| Example 15 | 9  | 60 | 40 | 0  | 0  | 0  | 1000 | 3.2 | 210 | 5.6 |
| Example 16 | 19 | 65 | 0  | 20 | 10 | 0  | 1000 | 3.1 | 240 | 5.1 |
| Example 17 | 23 | 75 | 25 | 0  | 0  | 0  | 1000 | 2.7 | 220 | 4.7 |
| Example 18 | 23 | 70 | 30 | 0  | 0  | 0  | 1020 | 2.8 | 230 | 4.8 |
| Example 19 | 23 | 75 | 0  | 25 | 0  | 0  | 1000 | 3.4 | 240 | 5.0 |
| Example 20 | 23 | 70 | 0  | 15 | 0  | 15 | 1020 | 3.0 | 200 | 4.6 |
| Example 21 | 1  | 95 | 0  | 5  | 0  | 0  | 1050 | 2.0 | 150 | 4.3 |

100° C./min, and maintained at the final temperature for 10 to 50 hr to remove binder until the residual carbon content was reduced to 200 ppm or less. After the binder removal, the furnace temperature was raised to the sintering temperature listed in Table 4 at a heating rate of 100° C./hr, and maintained at the sintering temperature for 2 hr to complete compact sintering, and sintered sample was obtained.

The thermal expansion coefficient and relative dielectric constant of obtained sintered ceramics (sintered laminate of green sheet of 50 mm square) were measured in the same manner as described in Example 1. The bending strength of sintered samples was measured according to JIS standard (R1601), that is, the sintered ceramics was cut to specimens with a length of 38 mm, width of 4 mm, and thickness of 3 mm, and the three point bending test was carried out with a span of 30 mm. The measurement result is listed in Table 4.

The thermal expansion coefficient of sintered ceramic samples of Examples 5 to 21 and Comparative Example 1 ranges from 2.0 to 3.6×10⁻⁶/° C., these values are comparable with thermal expansion coefficient of silicon (3.0×10⁻⁶/° C.). The bending strength of sintered ceramics of Examples 5 to 21 and Comparative Example 1 is 150 MPa or higher, this value is enough for practical use. The sintering temperature for Examples 5 to 21 is 1,050° C. or lower. On the other hand, the sintering temperature for Comparative Example 1 is 1,100° C. to give unpreferable result. The excessive content of filler causes presumably the difficulty in sintering. Therefore, the filler content of not more than 40% is preferable.

The peripheral portion of sintered laminate was cut off to obtain central portion, and carbon content of the central portion was determined, and it was found that residual carbon was 200 ppm or less for Examples 5 to 21 and Comparative Example 1, the result is preferable. The resistance of copper conductor of sintered laminate comprising 150 mm square green sheets was measured by the four terminal method, and it was found that the specific resistance of copper conductor was as low as 3 $\mu\Omega$·cm for Examples 5 to 21 and Comparative Example 1, these values are preferable.

(2) Examination of binder removal temperature

Figure 10:
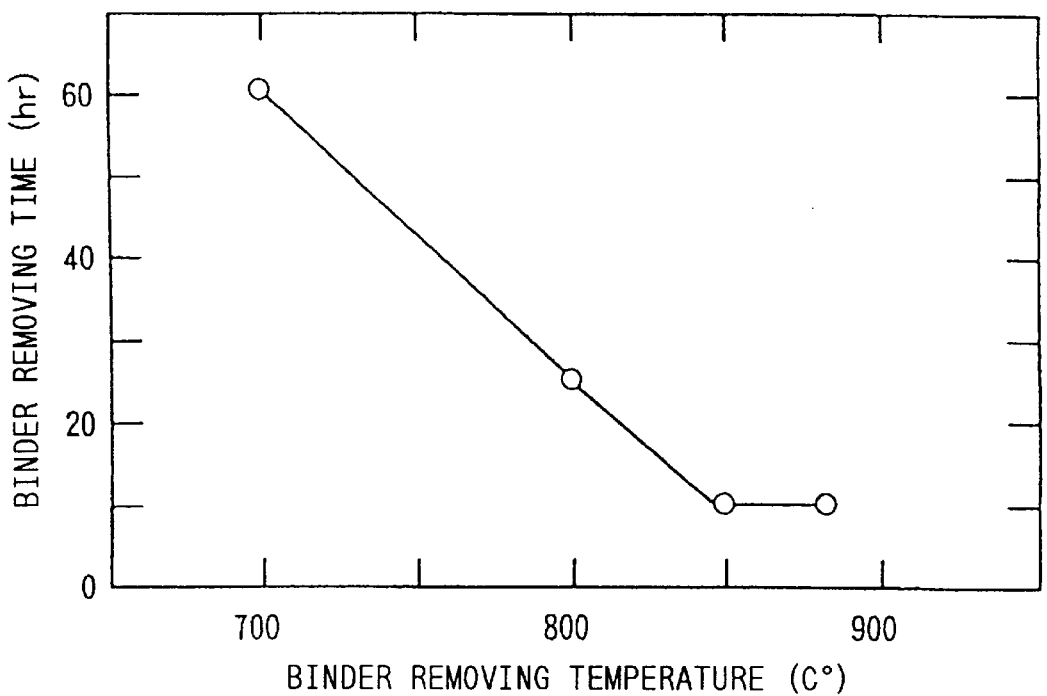
FIG. 10 is a graph for description of the relationship between binder removing temperature and binder removing time.

Heat treatment temperature for binder removal is examined. Using green sheet of Example 9, the green sheet was maintained at various temperatures to remove binder, and the time required for reducing residual carbon in sintered ceramics to 200 ppm (binder removing time) was measured. The result is shown in FIG. 10. It is obvious from FIG. 10 that the higher heat treatment temperature shorten the retention time at the temperature, and it is preferable.

(3) Examination of filler content

The filler content required for binder removal is examined. Green sheets which were prepared using glasses with various compositions and filler in various amounts (mullite $(3Al_2O_3.2SiO_2)$) were subjected to binder removal at 800 or 850° C., in some cases residual carbon content was reduced to 200 ppm or less and in some cases residual carbon content was not reduced to 200 ppm or less. For the former cases, the relationship between softening point of glass and filler content were obtained. The result is shown in FIG. 11.

Figure 11:
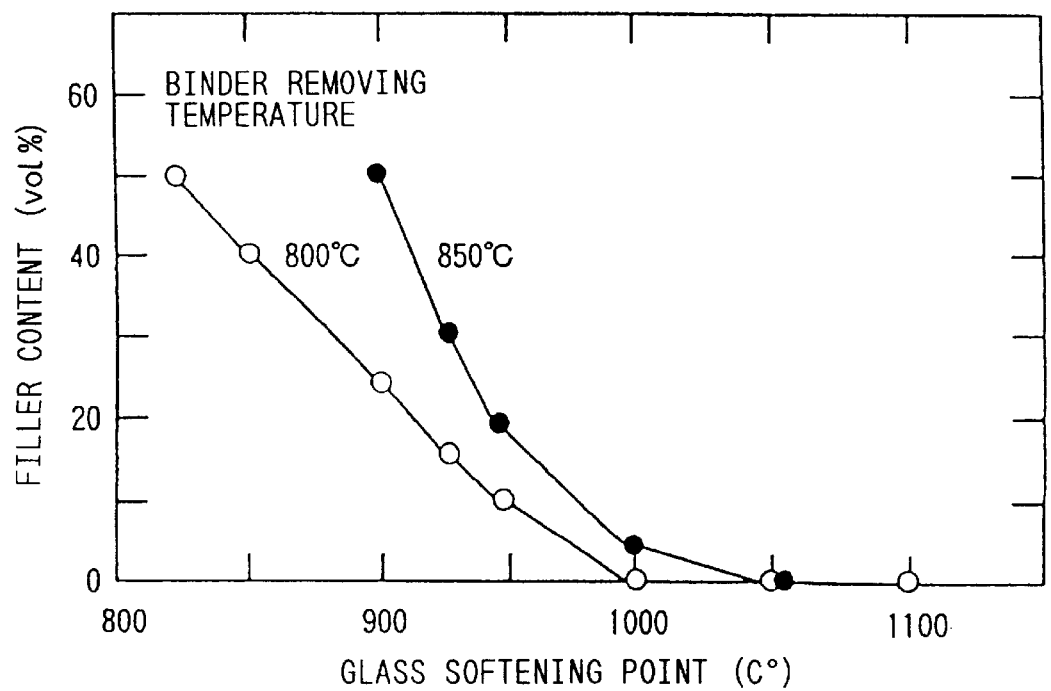
FIG. 11 is a graph for description of the relationship between softening point of glass and filler content required for binder removal.

As obvious in FIG. 11, filler content required for binder removal increases with lowering of softening point of glass. The higher heat treatment temperature for binder removal requires the more amount of filler, because for completion of binder removal it is required that sintering of glass does not proceed during the heat treatment for binder removal. Therefore, the lower softening point and higher binder removing temperature require the higher content of filler which obstructs sintering.

Figure 12:
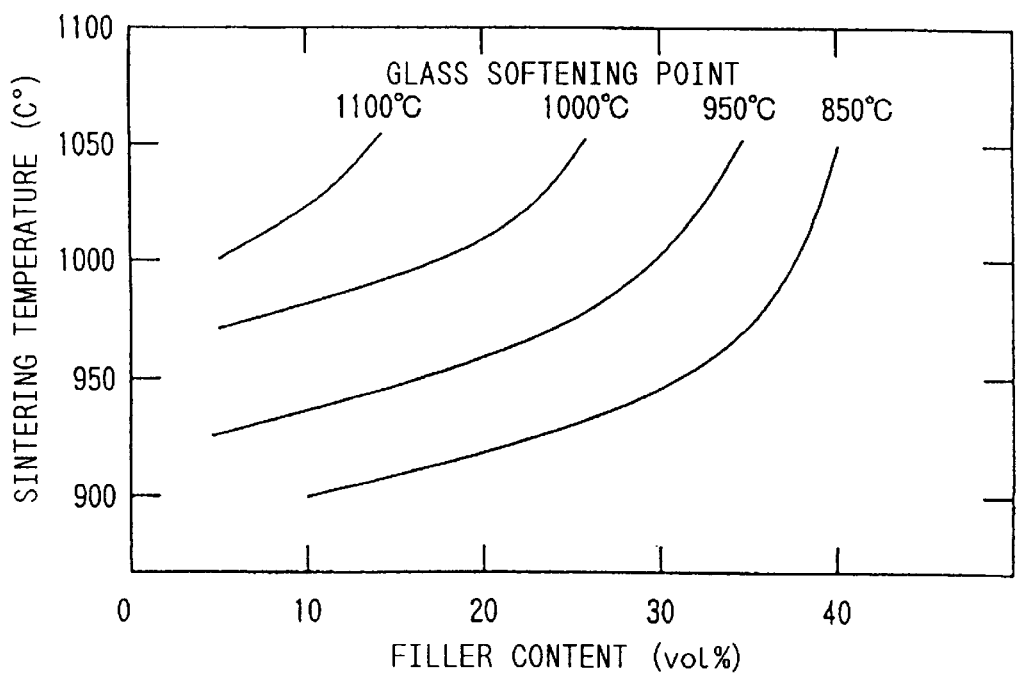
FIG. 12 is a set of curves for description of the relationship between compact sintering temperature and filler content, and softening point for glass-filler composition.

Filler content required for compact sintering and sintering temperature are examined. Four glass powders of the first composition (softening point of 1,100° C.), the second composition (softening point of 1,000° C.), the fifth composition (softening point of 950° C.), and the tenth composition (softening point of 850° C.) were added with various amounts of filler (mullite) to prepare green sheets, the green sheet was subjected to binder removal treatment, and sintered, when, sintering temperature, which is enough high to obtain sintered sample with relative density of 98%, was determined. The relationship between determined sintering temperature and filler content is shown in FIG. 12 for each softening point of glasses. It is obvious in FIG. 12 that the higher filler content and higher softening point require the higher heat treatment temperature required for compact sintering (sintering temperature).

Figure 13:
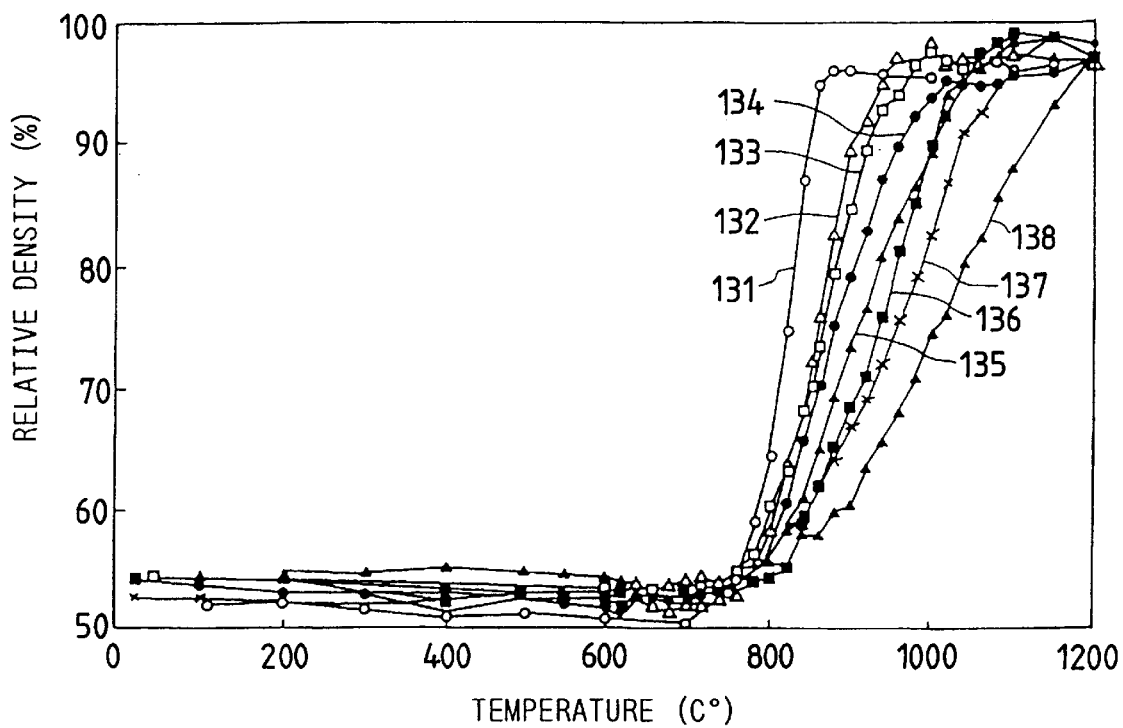
FIG. 13 is a set of curves for description of sintering compaction for glass-filler composition.

The relationship between filler content and sintering temperature is examined referring to sintering compaction curves shown in FIG. 13. The sintering compaction curves were obtained by the following method. A green sheet laminate was placed in a transparent quartz glass reaction tube, the temperature was raised at a heating rate of 100° C./min, the shape and size of the green sheet laminate was measured by photographing the green sheet laminate at various temperatures, and the relative density was calculated from the measured values. In FIG. 13, a curve 131 is the sintering curve for green sheet prepared using the glass of the fourteenth composition (no filler), and curves 132 to 138 are the sintering curves for green sheets of Examples 5 to 11.

The curve 131 shows that a green sheet containing no filler is sintered abruptly at a temperature near 800° C. and compacted. On the other hand, the curves 132 to 138 show the sintering behavior of green sheets of Examples 5 to 11 comprising glass of the fourteenth composition and 10 to 40% by volume of filler, that is, the slope of the sintering compaction curve becomes gentle with the increasing of filler content, the gentle slope suggests difficulty in sintering. Sintering compaction curves shown in FIG. 13 are obtained at the retention time of zero at each temperature, and by prolonging the retention time the compaction will presumably proceed additionally.

To complete sintering within a short time using a sintering temperature of 1,050° C. or lower, reduced filler content and use of glass with low softening point are required. On the other hand, as described hereinbefore, excessively low filler content and excessively low glass softening point can cause incomplete binder removal. In some cases that the filler content and softening point allows complete binder removal, the filler content and the softening point is not be preferable because of excessively high sintering temperature. For example, it is understandable from FIG. 11 that when a glass of 820° C. softening point is used and filler content is 50% by volume, binder is removed at 800° C., but as estimated from FIG. 12 the sintering temperature will be unpreferably 1,050° C. or higher. Therefore, when a glass with the fourteenth composition is used, the highest filler content is estimated to be 40% by volume to allow compact sintering at temperature of 1,050° C. or lower. Sintering compaction curve for other glasses with different compositions is obtained by parallel displacement in the abscissa direction of sintering compaction curve (curve 131) for a glass with the fourteenth composition in FIG. 13 depending on the glass softening point.

The relationship between bending strength of sintered sample and filler content is examined. In addition to sintered samples obtained in Examples 5 to 11, sintered samples, which were prepared by binder removing and sintering a green sheet comprising glass of the fourteenth composition without addition of filler, and by binder removing and sintering a green sheet comprising glass of the fourteenth composition and 5% by volume of mullite filler, were prepared, and the bending strength of these sintered samples was measured according to JIS standard (R1601), that is, a specimen with a length of 38 mm, width of 4 mm, and thickness of 3 mm was prepared and the specimen was subjected to the three point bending test with a span of 30 mm. The obtained relationship between bending strength and filler content is shown in FIG. 14.

Figure 14:
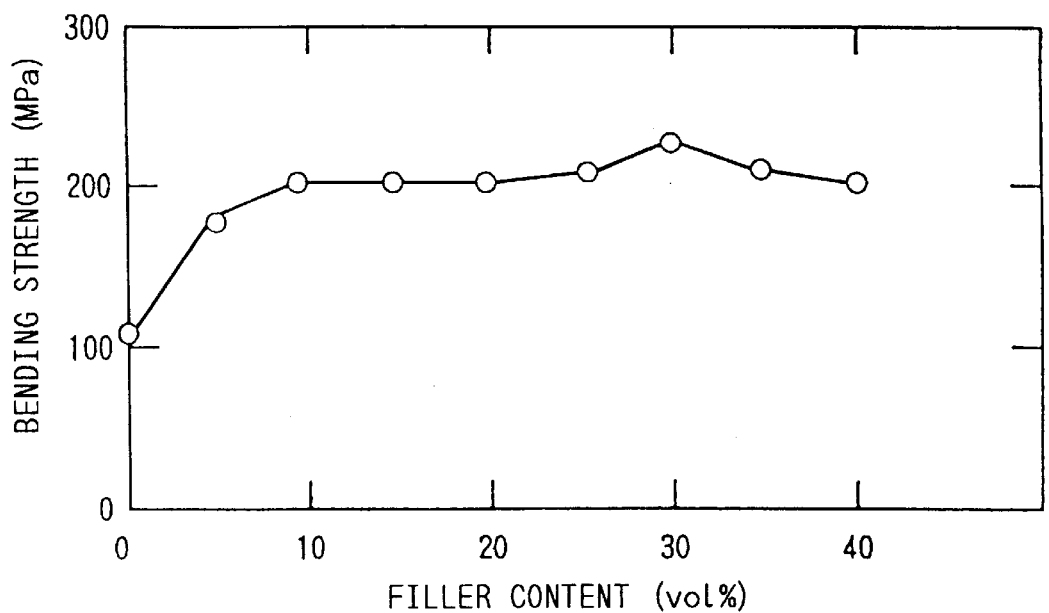
FIG. 14 is a graph for description of the relationship between bending strength and filler content for glass-filler sintered composition.

From FIG. 14, it is obvious that in a filler content range from 5% by volume to 40% by volume, bending strength of practical level is preferably obtained (in this case bending strength of 150 MPa or higher). The bending strength of 200 MPa or higher is more preferable.

EXAMPLE 22

Figure 15:
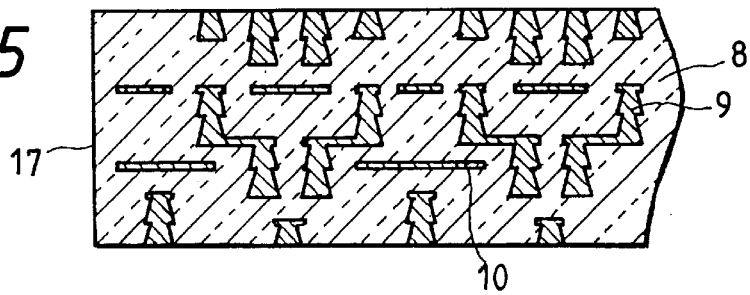
FIG. 15 is a sectional view of a multilayer circuit substrate.

A multilayer circuit substrate (40 layers) shown in FIG. 15 was manufactured in the same manner as described in Example 5. The multilayer circuit substrate 17 in this example comprises via holes 9 with copper conductor, circuit 10, and a sintered glass ceramics 8.

Figure 16:
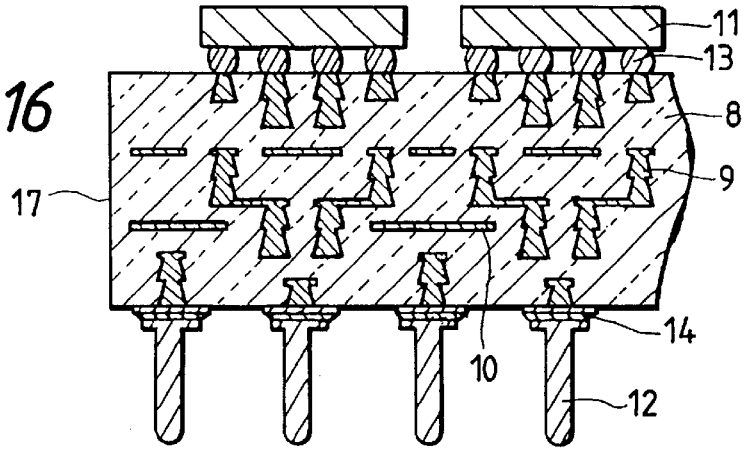
FIG. 16 is a sectional view of a multilayer circuit substrate mounted with LSIs and I/O pins.
Figure 17:
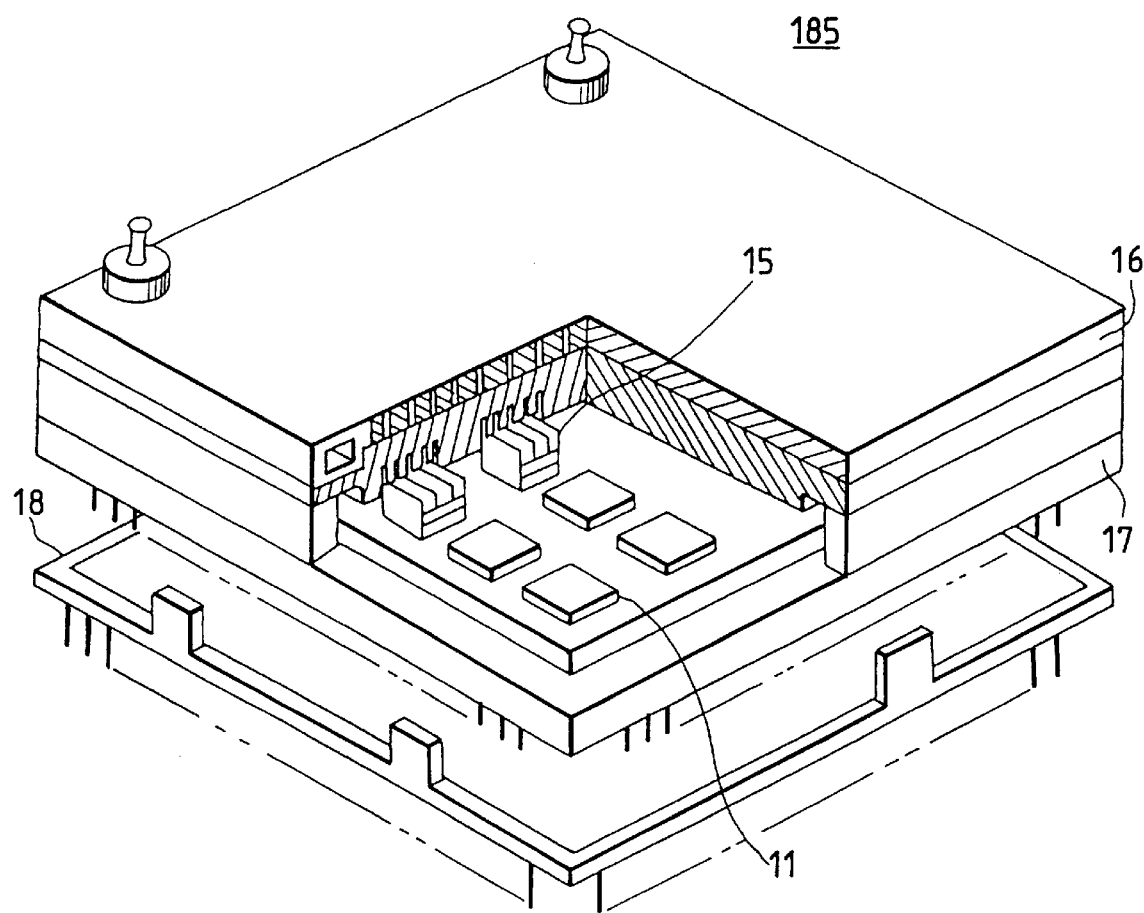
FIG. 17 is a partial sectional view of an instruction processor module.
Figure 18:
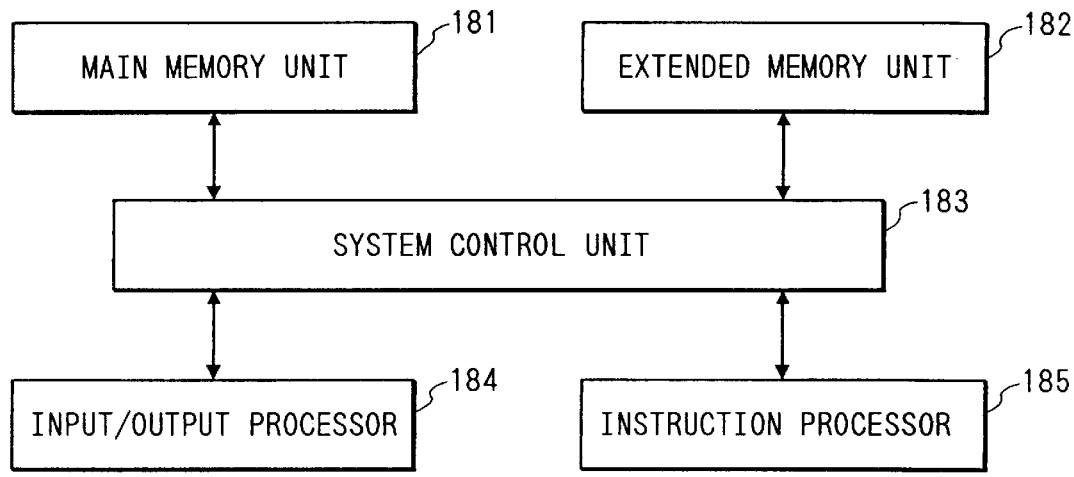
FIG. 18 is a diagram for illustrating the system structure of an electronic computer.

Then, LSIs (large-scale integrated circuit) 11 and I/O (input output) pins 12 were mounted using connecting solders 13, 14 as shown in FIG. 16, and subsequently microfins 15, a cooling jacket 16, and a connector 18 were mounted as shown in FIG. 17 to construct an instruction processor 185.

Using this instruction processor 185, an electronic computer having a main memory unit 181, an expanded memory unit 182, a system controller 183, input/output processor 184, and the instruction processor 185 was fabricated, and the processing speed of this computer was compared with that of a conventional electronic computer having an instruction processor which utilizes multilayer circuit substrate comprising mullite as substrate material and tungsten as conducting material, the processing speed of the electronic computer of the invention was twice that of the conventional electronic computer.

Circuit substrate manufactured in the same manner as described in Example 22 is widely applied to electronic circuit devices such as electronic computers, especially when high speed and high density are required.

As described hereinbefore, the present invention provides a circuit substrate having various advantages, such as easy binder removal, easy compact sintering, thermal expansion coefficient adjustable to the thermal expansion coefficient of silicon which is preferable performance as substrate, sufficient bending strength, and sufficiently low relative dielectric constant. Especially, composition of the present invention has softening point of as high as 850 to 1,100° C., therefore sintering compaction scarcely occurs during heat treatment for binder removal, binder is removed with only low filler content, and compact sintering is completed within a short time. Glass contained in ceramic composition and the composition of the present invention has excellent water resistance, boric acid crystal does not crystallize on green sheet, and when ceramic composition of the present invention is heat-treated, crystobalite crystal does not crystallize preferably from borosilicate glass. Accordingly, the productivity of circuit substrate production is significantly enhanced by applying the present invention.

What is claimed is:

1. A process of manufacturing a circuit substrate, comprising the steps of:

preparing a slurry by mixing glass, filler, organic binder, and solvent, forming a green sheet from said slurry, forming a conductor by forming via holes and wiring using conducting material on said green sheet, and heating said green sheet at 700° to 880° C. to remove the binder, followed by heating at 900° to 1,050° C. to sinter, wherein said glass contains $SiO_2$, $B_2O_3$, and $R_2O$ (R represents alkali metal), and has a composition included in an area, in a triangular composition diagram of $SiO_2$—$B_2O_3$—$R_2O$, defined with five lines comprising a line connecting a point of first composition and a point of third composition, a line connecting the point of third composition and a point of tenth composition, a line connecting the point of tenth composition and a point of eleventh composition, a line connecting the point of eleventh composition and a point of fourth composition, and a line connecting the point of fourth composition and the point of first composition (the area includes the lines), wherein a total weight of $SiO_2$, $B_2O_3$, and $R_2O$ is 100%, the first composition consists of 88% by weight of $SiO_2$ and 12% by weight of $B_2O_3$, the third composition consists of 82% by weight of $SiO_2$ and 18% by weight of $B_2O_3$, the tenth composition consists of 84% by weight of $SiO_2$, 10% by weight of $B_2O_3$, and 6% by weight of $R_2O$, the eleventh composition consists of 90% by weight of $SiO_2$, 5% by weight of $B_2O_3$, and 5% by weight of $R_2O$, and the fourth composition consists of 89% by weight of $SiO_2$, 10% by weight of $B_2O_3$, and 1% by weight of $R_2O$.

2. A process of manufacturing a circuit substrate as claimed in claim 1, wherein said glass is a glass having the softening point of 850° to 1,1000° C.

3. A process of manufacturing a circuit substrate as claimed in claim 1, wherein said glass contains additionally $Al_2O_3$ in an amount of 90% or less to molar amount of said $R_2O$ component.

4. A process for manufacturing a circuit substrate as claimed in claim 1, wherein said glass contains additionally ZnO component in an amount of 1 to 4% by weight to the total weight of glass.

5. A process for manufacturing a circuit substrate as claimed in claim 1, further comprising a step of laminating a plurality of green sheets, on which at least one of said via holes and said wiring is provided, to form a green sheet laminate, the laminating being performed between said conductor forming step and the heating steps, the green sheet heated in said heating steps being said green sheet laminate.

6. A process for manufacturing a circuit substrate as claimed in claim 1, wherein said conductor is copper.

7. Glass having a composition included in an area, in a triangular composition diagram of $SiO_2$—$B_2O_3$—$R_2O$, defined with five lines comprising a line connecting a point of first composition and a point of third composition, a line connecting the point of third composition and a point of tenth composition, a line connecting the point of tenth composition and a point of eleventh composition, a line connecting the point of eleventh composition and a point of fourth composition, and a line connecting the point of fourth composition and the point of first composition (the area includes the lines), wherein a total weight of $SiO_2$, $B_2O_3$, and $R_2O$ is 100%, the first composition consists of 88% by weight of $SiO_2$ and 12% by weight of $B_2O_3$, the third composition consists of 82% by weight of $SiO_2$ and 18% by weight of $B_2O_3$, the tenth composition consists of 84% by weight of $SiO_2$, 10% by weight of $B_2O_3$, and 6% by weight of $R_2O$, the eleventh composition consists of 90% by weight of $SiO_2$, 5% by weight of $B_2O_3$, and 5% by weight of $R_2O$, and the fourth composition consists of 89% by weight of $SiO_2$, 10% by weight of $B_2O_3$, and 1% by weight of $R_2O$.

8. Glass ceramic composition for circuit substrates, comprising 60 to 95% by volume of glass and 40 to 5% by volume of filler, said glass containing $SiO_2$, $B_2O_3$, and $R_2O$ (R represents an alkali metal) and having a composition included in an area, in a triangular composition diagram of $SiO_2$—$B_2O_3$—$R_2O$, defined with five lines comprising a line connecting a point of first composition and a point of third composition, a line connecting the point of third composition and a point of tenth composition, a line connecting the point of tenth composition and a point of eleventh composition, a line connecting the point of eleventh composition and a point of fourth composition, and a line connecting the point of fourth composition and the point of first composition (the area includes the lines), wherein a total weight of $SiO_2$, $B_2O_3$, and $R_2O$ is 100%, the first composition consists of 88% by weight of $SiO_2$ and 12% by weight of $B_2O_3$, the third composition consists of 82% by weight of $SiO_2$ and 18% by weight of $B_2O_3$, the tenth composition consists of 84% by weight of $SiO_2$, 10% by weight of $B_2O_3$, and 6% by weight of $R_2O$, and the eleventh composition consists of 90% by weight of $SiO_2$, 5% by weight of $B_2O_3$, and 5% by weight of $R_2O$, the fourth composition consists of 89% by weight of $SiO_2$, 10% by weight of $B_2O_3$, and 1% by weight of $R_2O$.

9. An electronic circuit module comprising:

a multilayered circuit substrate with circuit substrates containing amorphous glass with a softening point in a range of 850° to 1100° C., so as to facilitate removal of binder from green sheets used in forming the multilayered circuit substrate, and Cu wiring formed on said circuit substrates; and LSIs and I/O pins mounted on the multilayered circuit substrate and connected to the Cu wiring.

10. An electronic circuit module as claimed in claim 9, wherein said amorphous glass has a thermal expansion coefficient of $2.5 \times 10^{-6}$ to $3.5 \times 10^{-6}$ and $B_2O_3$ elution of 0 to 2.0 mg/m².

11. An electronic circuit module as claimed in claim 9, wherein said circuit substrate contains 60 to 95% by volume of amorphous glass and 5 to 40% by volume of filler.

12. An electronic circuit module as claimed in claim 11, wherein said filler is at least one of alumina, mullite, cordierite and quartz.

13. An electronic circuit module as claimed in claim 9, wherein said glass has a glass softening point in a range of 900° to 1100° C.

14. An electronic circuit module as claimed in claim 9, wherein the circuit substrates are substrates formed by removing the binder at a temperature of more than 850° C.

15. An electronic circuit module for an instruction processor, comprising:
 a multilayered circuit substrate containing an amorphous glass with softening point in a range of 850° to 1100° C., so as to facilitate removal of binder from green sheets used in forming the multilayered circuit substrate, and Cu wiring formed on said circuit substrate;
 LSIs mounted on the multilayered circuit substrate; and
 I/O pins and cooling parts connected to the multilayer circuit substrate.

16. An electronic circuit module as claimed in claim 15, wherein said amorphous glass has a thermal expansion coefficient of $2.5 \times 10^{-6}$ to $3.5 \times 10^{-6}$ and $B_2O_3$ elution of 0 to 2.0 mg/m$^2$.

17. An electronic circuit module as claimed in claim 16, wherein said multilayer circuit substrate contains said amorphous glass and filler which is at least one of alumina, mullite, cordierite and quartz.

18. An electronic circuit module as claimed in claim 15, wherein said glass has a glass softening point in a range of 900° to 1100° C.

19. An electronic circuit module as claimed in claim 15, wherein the circuit substrate is a substrate formed by removing the binder at a temperature of more than 850° C.

20. A multilayered circuit substrate comprising:
 circuit substrates with relative dielectric constant of 4.3 to 5.6, said substrates containing amorphous glass with a softening point in a range of 850° to 1100° C., so as to facilitate removal of binder from green sheets used in forming the multilayered circuit substrate; and
 Cu wiring formed on said circuit substrates.

21. A multilayered circuit substrate as claimed in claim 20, wherein the glass has a glass softening point in a range of 900° to 1100° C.

22. A multilayered circuit substrate as claimed in claim 20, wherein the circuit substrates are substrates formed by removing the binder at a temperature of more than 850° C.

23. An electronic computer comprising:
 an electronic circuit module for an instruction processor having a multilayered circuit substrate with circuit substrates containing amorphous glass with a softening point in a range of 850° to 1100° C., so as to facilitate removal of binder from green sheets used in forming the multilayered circuit substrate, and Cu wiring formed on said circuit substrates, and LSIs mounted on the multilayered circuit substrate, and I/O pins and cooling parts connected to the multilayered circuit substrate;
 a system controlled connected to said electronic circuit module;
 a memory connected to said system controller; and
 an I/O processor connected to said system controller.

24. An electronic computer as claimed in claim 23, wherein said amorphous glass has a thermal expansion coefficient of $2.5 \times 10^{-6}$ to $3.5 \times 10^{-6}$ and $B_2O_3$ elution of 0 to 2.0 mg/m$^2$.

25. An electronic computer as claimed in claim 24, wherein said multilayer circuit substrate contains an amorphous glass and filler which is at least one of alumina, mullite, cordierite and quartz.

26. An electronic computer as claimed in claim 23, wherein the glass has a glass softening point in a range of 900° to 1100° C.

27. An electronic computer as claimed in claim 23, wherein the circuit substrates are substrates formed by removing the binder at a temperature of more than 850° C.

28. An electronic circuit module comprising:
 a multilayered circuit substrate with circuit substrates containing amorphous glass with a glass softening point of 900° to 1100° C. and Cu wiring formed on said circuit substrates; and
 LSIs and I/O pins mounted on the multilayered circuit substrate and connecting to the Cu wiring.

29. An electronic circuit module as claimed in claim 28, wherein the multilayered circuit substrate is a substrate formed by processing including removing binder from green sheets for forming the circuit substrate, at a temperature of more than 850° C.

30. An electronic circuit module for an instruction processor, comprising:
 a multilayered circuit substrate with circuit substrates containing amorphous glass with a glass softening point of 900° to 1100° C. and Cu wiring formed on said circuit substrates;
 LSIs mounted on the multilayered circuit substrate; and
 I/O pins and cooling parts connected to the multilayered circuit substrate.

31. An electronic circuit module as claimed in claim 30, wherein the multilayered circuit substrate is a substrate formed by processing including removing binder from green sheets for forming the circuit substrate, at a temperature of more than 850° C.

32. A multilayered circuit substrate comprising:
 circuit substrates with relative dielectric constant of 4.3 to 5.6 and containing amorphous glass with a glass softening point of 900° to 1100° C.; and
 Cu wiring formed on said circuit substrates.

33. A multilayered circuit substrate as claimed in claim 32, wherein the circuit substrates are substrates formed by processing including removing binder from green sheets for forming the circuit substrates, at a temperature of more than 850° C.

34. An electronic computer comprising:
 an electronic circuit module for an instruction processor having a multilayered circuit substrate with circuit substrates containing amorphous glass with a glass softening point of 900° to 1100° C. and Cu wiring formed on said circuit substrates, LSIs mounted on the multilayered circuit substrate, and I/O pins and cooling parts connected to the multilayered circuit substrate;
 a system controller connected to said electronic circuit module;
 a memory connected to said system controller; and
 an I/O processor connected to said system controller.

35. An electronic computer as claimed in claim 34, wherein the multilayered circuit substrate is a substrate formed by processing including removing binder from green sheets for the multilayered circuit substrate, at a temperature of more than 850° C.

36. A multilayered circuit substrate comprising:

circuit substrates with relative dielectric constant of 4.3 to 5.6, said substrates containing amorphous glass with a softening point in a range of 850° to 1100° C., so as to facilitate removal of binder from green sheets used in forming the multilayered circuit substrate, wherein said amorphous glass has a thermal expansion coefficient of $2.5 \times 10^{-6}$ to $3.5 \times 10^{-6}$; and Cu wiring formed on said circuit substrates.

37. A electronic circuit module comprising:

a multilayered circuit substrate with circuit substrates having a relative dielectric constant of 4.3 to 5.6, said substrates containing amorphous glass with a softening point in a range of 850° to 1100° C., so as to facilitate removal of binder from green sheets used in formed the multilayered circuit substrate, wherein said amorphous glass has a thermal expansion coefficient of $2.5 \times 10^{-6}$ to $3.5 \times 10^{-6}$, and Cu wiring formed on said circuit substrates; and LSIs and I/O pins mounted on the multilayered circuit substrate and connected to the Cu wiring.

38. An electronic computer comprising:

an electronic circuit module including a multilayered circuit substrate with circuit substrates and Cu wiring formed on said circuit substrates, and LSIs and I/O pins mounted on the multilayered circuit substrate and connected to the Cu wiring, said circuit substrates having a relative dielectric constant of 4.3 to 5.6 and containing amorphous glass with a softening point in a range of 850° to 1100° C., so as to facilitate removal of binder from green sheets used in forming the multilayered circuit substrate, wherein said amorphous glass has a thermal expansion coefficient of $2.5 \times 10^{-6}$ to $3.5 \times 10^{-6}$;

a system controller connected to said electronic circuit module;

a memory connected to said system controller; and an I/O processor connected to said system controller.

39. A multilayered circuit substrate comprising:

circuit substrates with relative dielectric constant of 4.3 to 5.6, said substrates containing amorphous glass with a softening point in a range of 850° to 1100° C., so as to facilitate removal of binder from green sheets used in forming the multilayered circuit substrate, wherein said amorphous glass has $B_2O_3$ elution of 0 to 2.0 mg/m$^2$; and Cu wiring formed on said circuit substrates.

40. A electronic circuit module comprising:

a multilayered circuit substrate with circuit substrates having a relative dielectric constant of 4.3 to 5.6, said substrates containing amorphous glass with a softening point in a range of 850° to 1100° C., so as to facilitate removal of binder from green sheets used in formed the multilayered circuit substrate, wherein said amorphous glass has $B_2O_3$ elution of 0 to 2.0 mg/m$^2$, and Cu wiring formed on said circuit substrates; and LSIs and I/O pins mounted on the multilayered circuit substrate and connected to the Cu wiring.

41. An electronic computer comprising:

an electronic circuit module including a multilayered circuit substrate with circuit substrates and Cu wiring formed on said circuit substrates, and LSIs and I/O pins mounted on the multilayered circuit substrate and connected to the Cu wiring, said circuit substrates having a relative dielectric constant of 4.3 to 5.6 and containing amorphous glass with a softening point in a range of 850° to 1100° C., so as to facilitate removal of binder from green sheets used in forming the multilayered circuit substrate, wherein said amorphous glass has $B_2O_3$ elution of 0 to 2.0 mg/m$^2$;

a system controller connected to said electronic circuit module;

a memory connected to said system controller; and an I/O processor connected to said system controller.

42. A multilayered circuit substrate comprising:

circuit substrates with relative dielectric constant of 4.3 to 5.6, said substrates containing amorphous glass with a softening point in a range of 850° to 1100° C., wherein said amorphous glass has a thermal expansion coefficient of $2.5 \times 10^{-6}$ to $3.5 \times 10^{-6}$ and $B_2O_3$ elution of 0 to 2.0 mg/m$^2$; and Cu wiring formed on said circuit substrates.

43. A electronic circuit module comprising:

a multilayered circuit substrate with circuit substrates having a relative dielectric constant of 4.3 to 5.6, said substrates containing amorphous glass with a softening point in a range of 850° to 1100° C., wherein said amorphous glass has as thermal expansion coefficient of $2.5 \times 10^{6}$ to $3.5 \times 10^{-6}$ and $B_2O_3$ elution of 0 to 2.0 mg/m$^2$, and Cu wiring formed on said circuit substrates; and LSIs and I/O pins mounted on the multilayered circuit substrate and connected to the Cu wiring.

44. An electronic computer comprising:

an electronic circuit module including a multilayered circuit substrate with circuit substrates and Cu wiring formed on said circuit substrates, and LSIs and I/O pins mounted on the multilayered circuit substrate and connected to the Cu wiring, said circuit substrates having a relative dielectric constant of 4.3 to 5.6 and containing amorphous glass with a softening point in a range of 850° to 1100° C., wherein said amorphous glass has a thermal expansion coefficient of $2.5 \times 10^{-6}$ to $3.5 \times 10^{-6}$ and $B_2O_3$ elution of 0 to 2.0 mg/m$^2$;

a system controller connected to said electronic circuit module;

a memory connected to said system controller; and an I/O processor connected to said system controller.

\* \* \* \* \*